United States Patent
Iwashita et al.

(10) Patent No.: US 7,244,389 B2
(45) Date of Patent: Jul. 17, 2007

(54) METHOD OF MANUFACTURING PIEZOELECTRIC CERAMICS

(75) Inventors: Shuzo Iwashita, Kokubu (JP); Shinichi Handa, Kokubu (JP)

(73) Assignee: Kyocera Corporation, Kyoto (JP)

( * ) Notice: Subject to any disclaimer, the term of this patent is extended or adjusted under 35 U.S.C. 154(b) by 169 days.

(21) Appl. No.: 10/722,157

(22) Filed: Nov. 25, 2003

(65) Prior Publication Data

US 2004/0104978 A1  Jun. 3, 2004

(30) Foreign Application Priority Data

Nov. 25, 2002  (JP)  ............................. 2002-341460
May 12, 2003  (JP)  ............................. 2003-133743

(51) Int. Cl.
  *H01L 41/00*  (2006.01)
  *H02N 2/00*  (2006.01)
(52) U.S. Cl. .................. 264/614; 264/271.11

(58) Field of Classification Search ................ 264/614, 264/271, 271.11; 310/363, 364
See application file for complete search history.

(56) References Cited

U.S. PATENT DOCUMENTS 5,504,388 A * 4/1996 Kimura et al. ............... 310/363
2004/0155944 A1* 8/2004 Takagi et al. .................. 347/68

FOREIGN PATENT DOCUMENTS

JP  11-034321  2/1999
JP  2000-232035  8/2000
JP  2000-281453  10/2000

* cited by examiner

*Primary Examiner*—Carlos Lopez
(74) *Attorney, Agent, or Firm*—Hogan & Hartson LLP

(57) ABSTRACT

The present invention provides piezoelectric ceramics having a thickness of 100 μm or less, surface flatness of 20 μm or less and maximum surface uneveness of 3 μm or less in arbitrary surface region, wherein in-plane variation in dielectric constant is 5% or less of an average dielectric constant. The piezoelectric ceramics are applied to an actuator used for a painting head because of small surface flatness and less in-plane variation in piezoelectric constant.

1 Claim, 6 Drawing Sheets

FIG. 9 (a) (PRIOR ART)
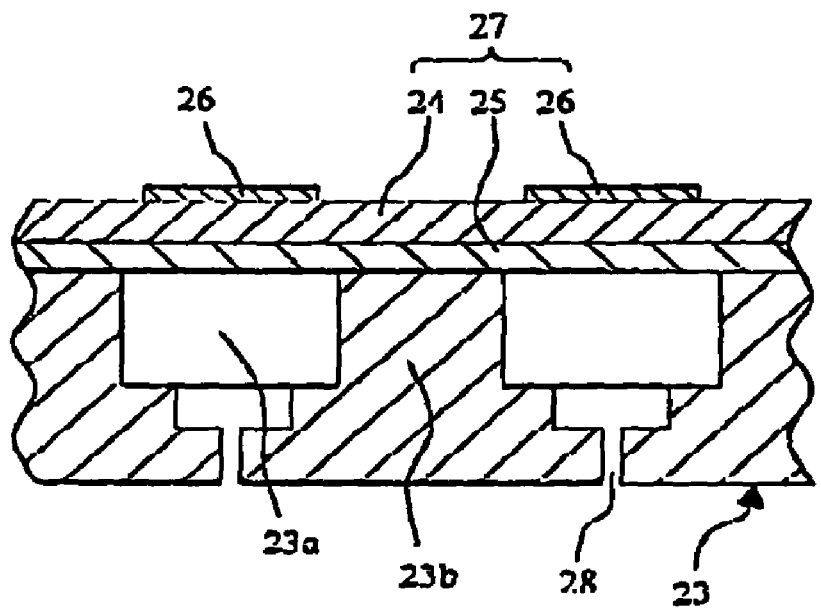
FIG. 9 (b) (PRIOR ART)
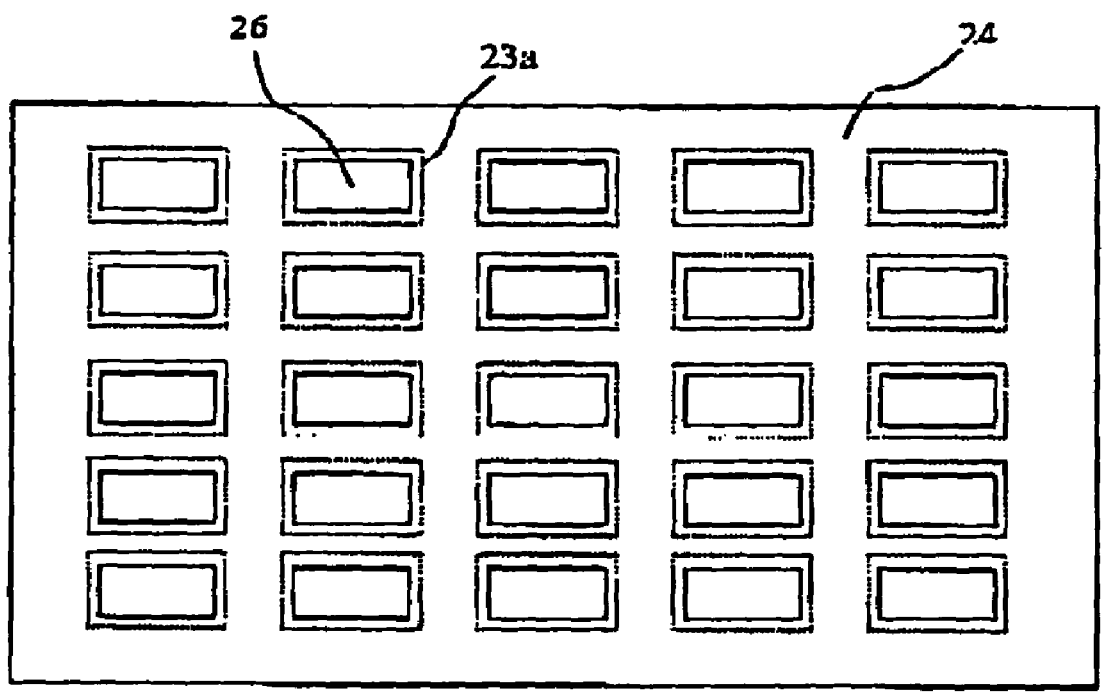

METHOD OF MANUFACTURING PIEZOELECTRIC CERAMICS

Priority is claimed to Japanese Patent Application No. 2002-341460, filed on Nov. 25, 2002 and Japanese Patent Application No. 2003-133743 filed May 12, 2003, the disclosure of which is incorporated by reference in its entirety.

BACKGROUND OF THE INVENTION

1. Field of the Invention

The present invention relates to piezoelectric ceramics and a method of manufacturing the same, an actuator and a method of manufacturing the same, and a printing head and an ink jet printer and, more particularly, to piezoelectric ceramics and an actuator (i.e., multilayer piezoelectric pile) that are suitable for piezoelectric sensors, for example, acceleration sensor, knocking sensor, AE sensor or the like, fuel injector, printing head for ink jet printer, piezoelectric resonator, oscillator, ultrasonic motor, ultrasonic oscillator and filter, and can be advantageously used particularly for a printing head that utilizes vibration of 2-dimensional vibration of expansion and contraction or linear vibration in longitudinal direction or in the direction of the thickness, and a method of manufacturing the same, and a printing head and an ink jet printer.

2. Description of Related Art

Piezoelectric ceramics have been used in, for example, piezoelectric actuator, filter, piezoelectric resonator (oscillator included), ultrasonic oscillator, ultrasonic motor and piezoelectric sensor.

Among these devices, the piezoelectric actuator is used as the positioning piezoelectric actuator for an X-Y stage of semiconductor manufacturing equipment, the actuator for the printing head of ink jet printer or the like, by making advantage of the very high response of the piezoelectric pile to electrical signals, in the order of $10^{-6}$ seconds. The ink jet printing head is mounted to various printers wherein characters or images are printed by discharging a drop of ink from a fine ink outlet orifice, recorders, facsimiles, or ink jet printers such as printer used for formation of patterns in the fields of textile printing and ceramic industry.

Piezoelectric ceramics employed in these applications have hitherto been manufactured by directly interposing a ceramic green sheet having several hundreds of μm between a pair of setters made of a porous sintered body, followed by firing.

There is also proposed a method of adjusting flatness of the sintered body in a range from 30 to 100 μm by arranging spacers on a setter base made of the porous material, arranging a setter cover on the spacers to form space, arranging a green sheet in the space, and firing the green sheet while keeping the space formed between the green sheet and the setter cover in a range from 30 to 100 μm (see, for example FIG. 3 of Japanese Unexamined Patent Publication No. 2002-281453).

When the ceramics body thus obtained is applied to a piezoelectric material, since smoothness of ceramics can be set to a given value or less, it is made possible to avoid breakage when an actuator is fixed onto the plane such as metal plate so as to fix into a printer. Therefore, it is preferably used as the actuator for the printing head of ink jet printer or the like, the positioning piezoelectric actuator for and X-Y stage.

However, according to the method of firing the green sheet while interposing between porous materials described in Japanese Unexamined Patent Publication No. 2000-281453, a component that is easy to evaporate through pores is evaporated and significant in-plane variation in composition occurs in case of obtaining an actuator having a thickness of 100 μm or less. It is difficult to control the surface state of the porous material, the resulting piezoelectric ceramics have increased flatness. Furthermore, deposition of particles degranulated from the setter increases flatness and surface roughness of the sintered body.

According to the method of firing the thin green sheet described in Japanese Unexamined Patent Publication No. 2000-281453, a space between the setters and the green sheet is at least 30 μm. Therefore, in case of obtaining an actuator having a thickness of 100 μm or less, flatness of ceramics increases relative to the thickness.

In case of large flatness, since piezoelectric ceramics are stretched so as to correct its curved state into a planar state when an actuator is fixed to a supporting substrate, residual stress is distributed unevenly across the piezoelectric actuator. In the case of an actuator having a thickness of 100 μm or less, comprising a piezoelectric substrate and a plurality of displacement elements provided on the piezoelectric substrate, its piezoelectric constant varies drastically depending on the displacement elements.

Therefore, there have been required to develop piezoelectric ceramics having small flatness and less in-plane variation in piezoelectric constant, and an actuator that has small flatness and also exhibits less in-plane variation in d constant even after bonding on the supporting substrate.

With recent development of multimedia, a non-impact type recording apparatus that employs an ink jet system or a heat transfer system has been developed in place of an impact type recording apparatus, and thus it has been spreading in the fields of various industries and domestic field.

Among these non-impact type recording apparatuses, a recording apparatus that employs an ink jet system has a bright future because of case of multi-gradation and coloration as well as 1 w running cost.

As shown in FIG. 9(a), a printing head that employs an ink jet system has such a structure that a plurality of channels are arranged in parallel as ink flow passages 23a and an actuator is provided on flow passage members 23 formed with partition walls 23b as a wall that partitions the respective ink flow passages 23a (see FIG. 1 of Japanese Unexamined Patent Publication No. 11-34321).

That is, an actuator is bonded with flow passage members 23 so that individual electrodes 26 are disposed right on ink flow passages 23a as openings of flow passages members 23 in an actuator wherein a common electrode 26 are formed on the other side and a plurality of displacement elements 27 are provided.

With such a configuration, a voltage is applied between the common electrode 25 and the individual electrodes 26, thereby to vibrate the displacement elements 27, and thus ink in ink flow passages 23a is compressed and a drop of ink is discharged from ink outlet orifices 28 that open at the bottom of the flow passages members 23.

As shown in FIG. 9(b), a lot of individual electrodes 26 are arranged in parallel on a piezoelectric layer 24 at equal distances to form a printing head provided with a lot of displacement elements 27, thereby making possible to contribute to realize high speed and high accuracy of an ink jet printer.

It has recently been developed about an ink jet printer with high speed and high accuracy. As a result, the displacement element 27 having a close relation with discharge of ink, especially the piezoelectric layer 24 requires thickness reduction and piezoelectric characteristic with high accuracy. Specifically, a photoelectrically actuator with less variation in characteristic is required.

For the purpose of making the thickness of the ceramic layer and the piezoelectric layer uniform, there is made a trial of previously decreasing an amount of a solvent in a slurry for formation of a tape to around ⅓ of the amount of the prior art thereby to reduce variation in thickness during drying, making the thickness of the slurry uniform by passing through a plurality of rolls and subjecting the slurry to the drying step, thus reducing variation in green sheet having thickness of 500 μm (Japanese Unexamined Patent Publication No. 2000-232035).

However, according to the method of decreasing the amount of the solvent described in Japanese Unexamined Patent Publication No. 2000-232035, the slurry for formation of a tape has high viscosity and the tape thus formed has large thickness. Usually, a thick tape having a thickness of several hundreds of micrometers is merely formed because of less shrinkage caused during drying, and a thin tape having a thickness of 50 μm, especially several tens of micrometers can not be formed. To the contrary, the amount of the solvent contained in the slurry for formation of a tape must be increased so as to form a thin tape, and thus variation in thickness occurs during the drying step. Consequently, a thin tape with less variation in thickness can not be formed.

Therefore, a thin laminated piezoelectric pile having a thickness of 100 μm or less with less in-plane variation in thickness is required.

SUMMARY OF THE INVENTION

The piezoelectric ceramics of the present invention have been completed based on such a finding that deformation of a green sheet can be suppressed by firing while contacting the green sheet with a supporting member having dense and flat surface (especially while interposing the green sheet between supporting members) and evaporation from the green sheet can also be suppressed. According to the present invention, piezoelectric ceramics having small flatness and less variation in dielectric constant can be manufacture, thus making it possible to reduce in-plane variation in piezoelectric constant.

The piezoelectric ceramics of the present invention has a thickness of 100 μm or less, surface flatness of 20 μm or less and maximum surface uneveness of 3 μm or less, and in-plane variation in dielectric constant is 5% or less of an average dielectric constant.

When the resulting piezoelectric ceramics are applied to an actuator, variation in displacement due to deformation of the piezoelectric ceramics can be suppressed and therefore variation in ink discharge amount for printing head of an ink jet printer can be suppressed.

The method of manufacturing piezoelectric ceramics of the present invention comprises firing a green compact made of a piezoelectric ceramic powder while contacting with the surface (principal plane) of a supporting member whose surface having porosity of 5% or less and flatness of 20 μm or less. Consequently, aforementioned piezoelectric ceramics can be manufactured.

The green compact is preferably fired while being interposed between a pair of the supporting members. Consequently, it is made possible to easily achieve flatness of 20 μm or less even in case of thin piezoelectric ceramics having a thickness of 100 μm or less.

It is preferable that the green compact is made of a stock material powder of a perovskite compound containing Pb and the green compact is fired while being inserted into a sealed space. Consequently, piezoelectric ceramics with less variation in characteristic can be easily obtained even when using a green compact containing Pb as a volatile component.

It is preferable to satisfy the relations represented by the following expressions (1) and (2):

$$1.0001 \times (V2+V3) \leq V1 \leq 4.0000 \times (V2|V3) \tag{1}$$

$$0.02 \times V3 \leq V2 \leq 50 \times V3 \tag{2}$$

where V1 denotes a volume of a sealed space, V2 denotes a volume of a heavy object and V3 denotes a volume of a green compact, when a heavy object having surface roughness Ra of 1 μm or less, flatness of 20 μm or less and a volume V2 is placed on a green compact having a volume V3 and they are inserted into a scaled space having a volume V1. Consequently, it is made possible to suppress evaporation of the volatile component from a material to be fired and to effectively suppress variation in piezoelectric characteristic.

The actuator of the present invention comprises a piezoelectric substrate made of aforementioned piezoelectric ceramics, a plurality of surface electrodes provided on the surface of the piezoelectric substrate, and an internal electrode provided inside the piezoelectric substrate. Consequently, it is made possible to realize an actuator that has small flatness and also exhibits less in-plane variation in piezoelectric constant even after bonding on the supporting substrate. It is particularly preferable that the piezoelectric ceramics contain Pb and the internal electrodes contain Ag. Consequently, it is made possible to lower the firing temperatures in case of a piezoelectric pile containing Pb.

It is important to suppress in-plane variation in thickness of an actuator having a thickness of 100 μm or less so as to reduce variation in displacement of a lot of displacement elements provided on the surface of a piezoelectric substrate. It is important to form a green compact for formation of a tape using fine stock material powders and to press the green compact so as to reduce variation in displacement. Consequently, it is made possible to manufacture thin piezoelectric ceramics and to realize a printer capable of printing with higher speed, higher resolution and higher accuracy by using the resulting thin piezoelectric ceramics as a printing head of ink jet printer.

Another actuator (laminated piezoelectric pile) of the present invention comprises a piezoelectric substrate made of a plurality of piezoelectric ceramics layers and a plurality of displacement elements provided on the surface of the piezoelectric substrate, and the displacement elements comprises a pair of electrodes and a piezoelectric layer interposed among them, wherein a thickness of the piezoelectric ceramics layers and the piezoelectric layers is 50 μm or less, a total thickness is 100 μm or less, and in-plane variation in total thickness is 10% or less.

It is particularly preferable that the thickness of the electrodes is from 0.5 to 5 μm. Consequently, it is made possible to further reduce in-plane variation in thickness of the electrodes formed partially and to further suppress in-plane variation in displacement.

It is preferable that the thickness of the piezoelectric ceramics layers and the piezoelectric layers is from 5 to 15 μm or less and the total thickness is from 20 to 60 μm or less. Control of the thickness of the respective layers and the total thickness makes it possible to further suppress variation in displacement and in-plane variation in thickness of the respective layers and the total thickness and to obtain a laminated piezoelectric pile that exhibits stable displacement.

The method of manufacturing an actuator of the present invention comprises a mixing step of a piezoelectric ceramic powder having a average grain size of 1 μm or less and an organic binder component to prepare a slurry for formation of a tape, a forming step of forming the slurry for formation of a tape obtained in the mixing step into a green sheet by a tape forming process, a pressing step of pressing the green sheet obtained in the forming step, a laminating step of applying electrodes on the green sheet obtained in the pressing step and laminating the green sheets to obtain a laminated green compact, and a firing step of firing the laminated green compact obtained in the laminating step. Consequently, it is made possible to obtain aforementioned actuator.

The method of manufacturing an actuator of the present invention comprises the step of firing a plurality of green compacts made of a piezoelectric ceramic powder and a plurality of supporting members, each having the surface (principle plane) which has porosity at surface portion of 1% or less and flatness of 20 μm or less, while being laminated one on another. Consequently, it is made possible to improve the flatness of the piezoelectric ceramics and to stably from a lead atmosphere in the furnace, and thus distribution of piezoelectric characteristic of the substrate is stabilized and variation in d constant in the substrate can be more reduced.

The actuator of the present invention can be preferably used for a printing head of an ink jet printer. The printing head of the present invention comprises a supporting substrate comprising ink flow passages provided inside, and aforementioned actuator provided on the supporting substrate via an adhesive layer. Consequently, it is made possible to realize a printing head that enables stable printing, and the resulting printing head can be used preferably for an ink jet printer.

Furthermore, the jet printer of the present invention comprises aforementioned printing head, paper feeding averages for feeding a paper printing medium to be printed to the printing head, and paper ejecting averages for ejecting the printing medium printed using the printing head.

BRIEF DESCRIPTION OF THE DRAWINGS

FIG. 9(a) and FIG. 9(b) are respectively a schematic sectional view showing a laminated piezoelectric pile of the prior art and a schematic plan view showing a laminated piezoelectric pile of the prior art.

DESCRIPTION OF PREFERRED EMBODIMENTS

<First Embodiment>

Figure 1:
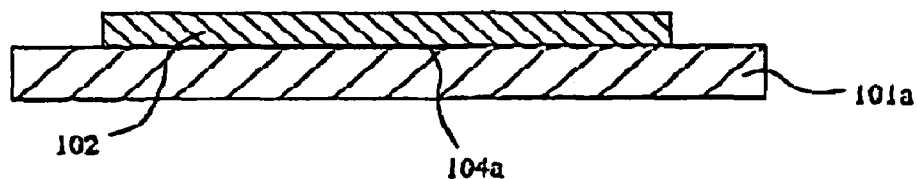
FIG. 1(a) and FIG. 1(b) are schematic sectional views for explaining a method of manufacturing piezoelectrics ceramics in the first embodiment of the present invention.
Figure 1:
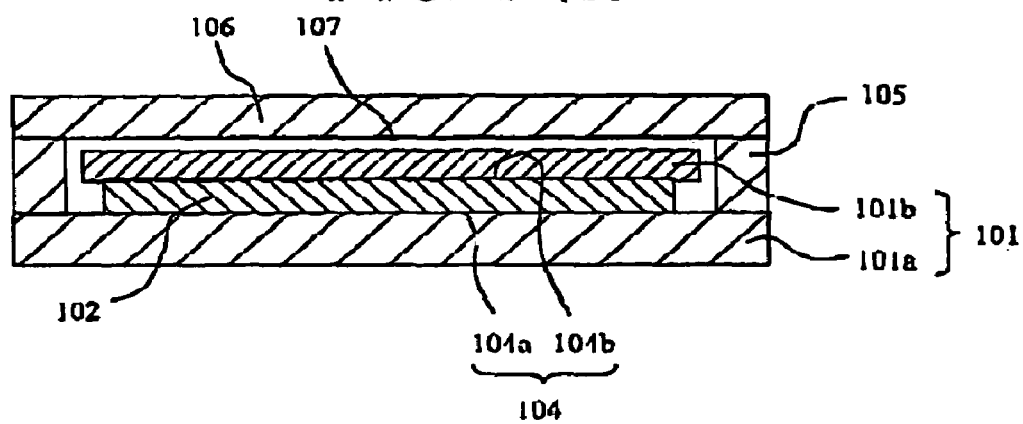

It is important that a thickness of the piezoelectric ceramics of the present invention is 100 μm or less. Piezoelectric ceramics with a larger displacement can be obtained by setting the thickness to 100 μm or less. To achieve larger displacement, the thickness of the piezoelectric ceramics is preferably 80 μm or less, more preferably 65 μm or less, and still more preferably 50 μm or less.

The lower limit of the thickness of the piezoelectric ceramics is preferably 3 μm or less, more preferably 5 μm or less, still more preferably 10 μm or less, and most preferably 20 μm or less, so as to achieve sufficient mechanical strength and to prevent breakage during handling and operation.

It is also important that flatness of the surface is 20 μm or less in the present invention. By setting the flatness of the surface of the ceramics to 20 μm or less, variation in characteristic of the ceramics can be suppressed. To further make characteristic uniform, the flatness is preferably 15 μm or less, and more preferably 10 μm or less. The flatness of the surface refers to a largest value of the height from a reference plane measured by scanning the entire surface in a predetermined direction using a high-accuracy surface shape measuring apparatus (for example, combined apparatus of a laser focus displacement meter and an X-Y stage, manufactured by KEYENCE CORPORATION).

It is also important that a maximum value of unevenness of the surface of the piezoelectric ceramics is 3 μm or less in the present invention. When the surface has small unevenness, fine deformation of an actuator can be prevented in case of fixing a piezoelectric pile as the actuator to a metal substrate and the effect of reducing residual stress can be enhanced. Also there is exerted the effect of suppressing evaporation of the volatile component through surface unevenness thereby to further reduce variation in composition.

Surface roughness Ra described hereinafter averages surface roughness in range (measuring range) of 100 μm×100 μm. The flatness refers to waviness including warp of the piezoelectric ceramics. To the contrary, aforementioned surface unevenness is evaluated in an intermediated range between the range of the surface roughness Ra and the range of the flatness. The evaluation in the intermediate range averages the degree of partial waviness and variation in characteristic can be easily improved by reducing partial waviness.

According to a specific method of measuring surface flatness, a sample is scanned in an area that accounts for 10% of the entire surface (about 2 to 10 mm square) using a high-accuracy surface shape measuring apparatus (for example, combined apparatus of a laser focus displacement meter and an X-Y stage, manufactured by KEYENCE CORPORATION) and, after mapping the height of the surface, the surface flatness is obtained from a difference between a maximum value and a minimum value of the height from a reference plane.

It is also important that in-plane variation in dielectric constant is 5% or less of an average dielectric constant. By calculating an average value of measured a dielectric constant of the surface of the piezoelectric ceramics and setting a maximum value of variation from the average value in 5% of the average value, variation in piezoelectric characteristic in the substrate of the actuator can be suppressed.

The surface roughness Ra of the surface of the piezoelectric ceramics is preferably 3 µm or less, more preferably 2.5 µm or less, and still more preferably 2 µm or less. When the surface has small roughness Ra, fine deformation of an actuator can be effectively prevented in case of fixing a piezoelectric pile as the actuator to a metal substrate and the effect of reducing residual stress can be enhanced. Also there is exerted the effect of suppressing evaporation of the volatile component through surface unevenness thereby to further reduce variation in composition.

The surface roughness Ra is determined by the following procedure. That is, surface unevenness is measured by scanning an are measuring 100 µm×100 µm using an atomic force microscope (AFM) and, after calculating a maximum value, an average value of values measured at random five points in the surface is calculated.

The piezoelectric ceramics can be made of a ceramic material that shows piezoelectricity, such as Bi layer compound, material having tungsten-bronze structure, alkali niobate compound of perovskite structure, lead magnesium niobate (PMN-based compound), lead nickel niobate (PNN-based compound), lead ziconate titanate (PZT) containing Pb, and lead titanate.

Among these materials, a perovskite compound containing at least Pb is preferable. Examples of the perovskite compound containing Pb include lead magnesium niobate (PMN-based compound), lead nickel niobate (PNN-based compound), lead zirconate titanate (PZT) containing, Pb, and lead titanate. With the composition, a piezoelectric vibration layer 4 having a high piezoelectric constant can be obtained. Among these materials, lead ziconate titanate containing Pb and lead titanate are preferable for obtaining larger displacement.

As an example of a perovskite crystal, a crystal containing Pb as a constituent element at site A and Zr and/or Ti as constituent element at site B can be preferably used. It is possible to mix with other oxides and other elements as auxiliary components may be substituted at site A and/or site B as far as characteristics are not adversely affected. Specifically, auxiliary components may be solid solution of $Pb(Zn_{1/3}Sb_{2/3})O_3$ and $Pb(Ni_{1/2}Te_{1/2})O_3$.

It is preferable to further include an alkali earth element as the constituent element at site A in the perovskite crystal. Examples of the alkali earth element include Ba, Sr and Ca, and Ba and Sr are particularly preferable since they enable it to achieve greater displacement. Consequently, relative dielectric constant is improved, thus making it possible to obtain a higher piezoelectric constant.

Specifically, for example, a compound having composition of $Pb_{1-x-y}Sr_xBa_y(Zn_{1/3}Sb_{2/3})_a(Ni_{1/2}Te_{1/2})_tZr_{1-a-b}Ti_cO_3$+ $\alpha$wt % $Pb_{1/2}NbO_3$ ($0 \leq x \leq 0.14$, $0 \leq y \leq 0.14$, $0.05 \leq a \leq 0.1$, $0.002 \leq b \leq 0.01$, $0.44 \leq c \leq 0.05$, $\alpha 0.01$ to $1.0$) may be used.

The piezoelectric ceramics preferably contain 0.1% by weight or less, preferably 0.07% by weight or less of carbon. Since carbon has a relation with insulating properties of a piezoelectric pile and causes poor insulation upon polarization, setting of the carbon content in the above range makes it possible to suppress current flow upon polarization and to polarize to a saturated polarization state. Therefore, poor displacement due to poor polarization can be prevented.

Porosity of the piezoelectric ceramics is preferably 5% or less, more preferably 1% or less, and most preferably 0.5% or less. Reduction of the porosity makes it possible to increase the strength of the piezoelectric ceramics and to suppress breakage of thin piezoelectric ceramics. When using as an ink jet printer head, it is made possible to effectively suppress ink leakage due to permeation of ink into the ceramics.

When using the piezoelectric ceramics of the present invention as an actuator for a printing head of an ink jet printer, $d_{31}$ mode is used as a piezoelectric strain constant. To exhibit sufficient discharge ability for a printing head of an ink jet printer and to realize printing with higher speed and higher accuracy, $d_{31}$ is preferably 150 pm/V or more, more preferably 200 pm/V or more, and most preferably 250 pm/V or more.

Now the method of manufacturing the piezoelectric ceramics of the present invention will be described below in the case of applying to an actuator used for a printing head, using PZT as the piezoelectric ceramics.

First, PZT powder having purity ob 99% and an average grain size of 1 µm or less was prepared as the material to make the piezoelectric ceramics. A mixture of the PZT powder and an organic binder is formed into a tape and the tape is coated with an Ag—Pd paste that makes the internal electrode on a desired part thereof, and then via holes are formed on a desired part thereof and electrodes are formed inside the via holes. The resulting green sheets are laminated one on another and optionally cut into a specific shape.

To find the resulting green compact, the green compact is put in a firing furnace while being placed on a jig. An example of arrangement is shown in FIG. 1(a). A green compact 102 is disposed on a lower supporting member 101a. It is important that the surface 104a of the lower supporting member 101a has porosity of 5% or less and flatness of 20 µm or less and the surface 104a is contacted with the green compact 102.

As shown in FIG. 1(b), a spacer 105 is disposed on the lower supporting member 101a and a top plate 106 is disposed on the spacer 105 to form a sealed space 107 by a firing jig comprising the lower supporting member 101a, the spacer 105 and the top plate 106, and then the green compact containing a volatile component can be suppressed by providing such a sealed space 107, the green compact can be fired without disposing a combination material around the green compact, like the prior art.

The term "sealed space 107" as used herein refers to a space which is not provided by merely assembling the above firing jig, but which can suppress scatter of the volatile component from the sealed space by enhancing sealability of the plane where the supporting member, the spacer and the top plate are mutually contacted by averages of machining such as grinding or polishing, chemical polishing or the like. Examples thereof include those having smooth surface achieved by enhancing parallelism of the surface by average of lapping and reducing the surface roughness.

In case the green compact is fired while being inserted into the sealed space, it is preferable to satisfy the following conditions. It is preferable to satisfy the following relations:

$$1.0001 \times (V2/V3) \leq V1 \leq 4.0000 \times (V2/V3) \qquad (1)$$

$$0.02 \times V3 \leq V2 \leq 50 \times V3 \qquad (2)$$

where V1 denotes a volume of a sealed space 107, V2 denotes a volume of an upper supporting members 101b (heavy object) and V3 denotes a volume of a green compact 102.

When V1 is smaller than 1.0001×(V2+V3), clearance between the upper supporting member 101b and the spacer 105 decreases and expansion and shrinkage are caused by heating and cooling during firing, thereby to cause biting and to drastically lower operability. On the other hand, when V1 is larger than 4.0000×(V2+V3), the amount of the volatile component evaporated from the green compact increases and variation in composition occurs, thereby to increase variation in piezoelectric characteristic in the substrate. When V2 is smaller than 0.02×V3, there is a tendency that the resulting sintered body has unevenness. On the other hand, when V2 is larger that 50×V3, variation in shrinkage rate of ceramics occurs and variation in piezoelectric characteristic sometimes increases.

If the green compact 102 is disposed on the lower supporting member 101a, a member to be disposed on the green compact 102 is not limited and, for example, a porous material may be disposed. It is preferable that an upper supporting member 101b having the same surface as that of the lower supporting member 101a is placed while interposing the green compact 102 between a pair of lower supporting members 101a, 101b, whereby, variation in composition can be effectively suppressed and flatness of 20 µm or less can be easily achieved.

It is important that the surface 104 of lower supporting members 101a, 101b, which is contacted with the green compact 102, has flatness 20 µm or less. Since the supporting member 101 is contacted with the green compact 102, the flatness of the surface of the sintered body obtained by firing the green compact 102 can be reduced by making the surface 104b flat, thus making it possible to obtain piezoelectric ceramics having flat surface. To obtain a sintered body having smaller flatness, the surface of the supporting member 101 preferably has flatness of 15 µm or less, and more preferably 10 µm or less.

It is important that the surface portion of the green compact 102, which is contacted with the supporting member 101, preferably has porosity of 5% or less, more preferably 1% or less, and most preferably 0.5% or less. When the surface 104 having small porosity of the supporting member 101 is dense, degranulation scarcely occurs and the amount of particles to be deposited on the surface roughness of the piezoelectric ceramics obtained by sintering.

The surface portion averages outermost surface on the surface 104 that forms a contact face with the green compact 102. Since the surface must be polished before measuring porosity, minimum thickness is required for actual polishing, for example, several micrometers and the portion having this minimum thickness is substantially referred to as the surface portion.

In the supporting member made of a porous material of the prior art, the component evaporated from the green compact 102 during firing scatters outside through continuous pores of the supporting member. According to the present invention, scatter of the volatile component can be remarkably suppressed because the supporting member 101a having a dense surface portion of the surface 104 used. As described above, in-plane variation in piezoelectric characteristic can be further improved by suppressing evaporation of the volatile component from the green compact 102.

The entire support member 101 is preferably dense. Such a dense material can be regenerated at low cost by processing the surface. It is also possible to use a sintered body having a dense surface, the inside of which has comparatively high porosity. In case the surface portion is easily sintered as compared with the inside during sintering, the surface layer preferably has porosity of 5% or less, 1% or less, or 0.5% or less at a distance of 0.1 mm, 0.3 mm or 0.5 mm from the surface.

If necessary, only the surface can be densified. For example, the porosity of the surface 104 of the supporting member 101 can be set to 0.1% or less by publishing the surface of a ceramic sintered body whose surface has porosity of about 2 to 8% and coating with a ceramic layer. It is possible to control the porosity of the surface to 1% or less and the flatness to 20 µm or less by forming the ceramic layer having a thickness of at least several tens of micrometers, preferably 50 µm or more, and most preferably 100 µm or more using a CVD (chemical vapor deposition) method, followed by mirror polishing. This is particularly effective in case the cost required to make the entire large-sized supporting member using a dense sintered body is high, or in case a dense sintered body is hardly made or the green compact is likely to react with the supporting member.

The surface roughness Ra of the surface 104 of the supporting member 101 is preferably 3 µm or less, more preferably 2.5 µm or less, and most preferably 2 µm or less. Consequently, it is made possible to further improve the flatness of the piezoelectric ceramics. In-plane variation in composition can also be suppressed by vaporizing the volatile component from the green component through clearance between the green compact and the supporting member, which serves as a diffusion path.

The supporting member 101 used in the present invention preferably contains a crystal of at least one kind selected from the group consisting of alumina, beryllia, zirconia, magnesia, mullite, spinel structure, bismuth layer compound, compound of tungsten bronze structure, compound of Pb-based perovakite structure, compound of niobium-based perovakite structure and compound of tantalum-based perovskite structure. These materials are materials that have the same quality as that of the piezoelectric pile, or have poor reactivity. Therefore, the reaction with the green sheet is suppressed, thus making it possible stabilize characteristic of the piezoelectric pile.

In case the supporting member 101 is made of zirconia, if preferably contains at least one kind selected from the group consisting of CaO, MgO, $Y_2O_3$ and rare earth elements. This suppresses phase transformation of zirconia during heating or cooling upon firing and also suppresses breakage (for example, cracks, chipping, etc.), deformation and change in surface roughness.

A average grain size of crystal constituting the supporting member 101 is preferably from 5 to 30 µm, more preferably from 10 to 25 µm, and most preferably from 15 to 20 µm, so as to reduce deformation due to heating or cooling an to prevent severe cracks and chipping from occurring.

Figure 2:
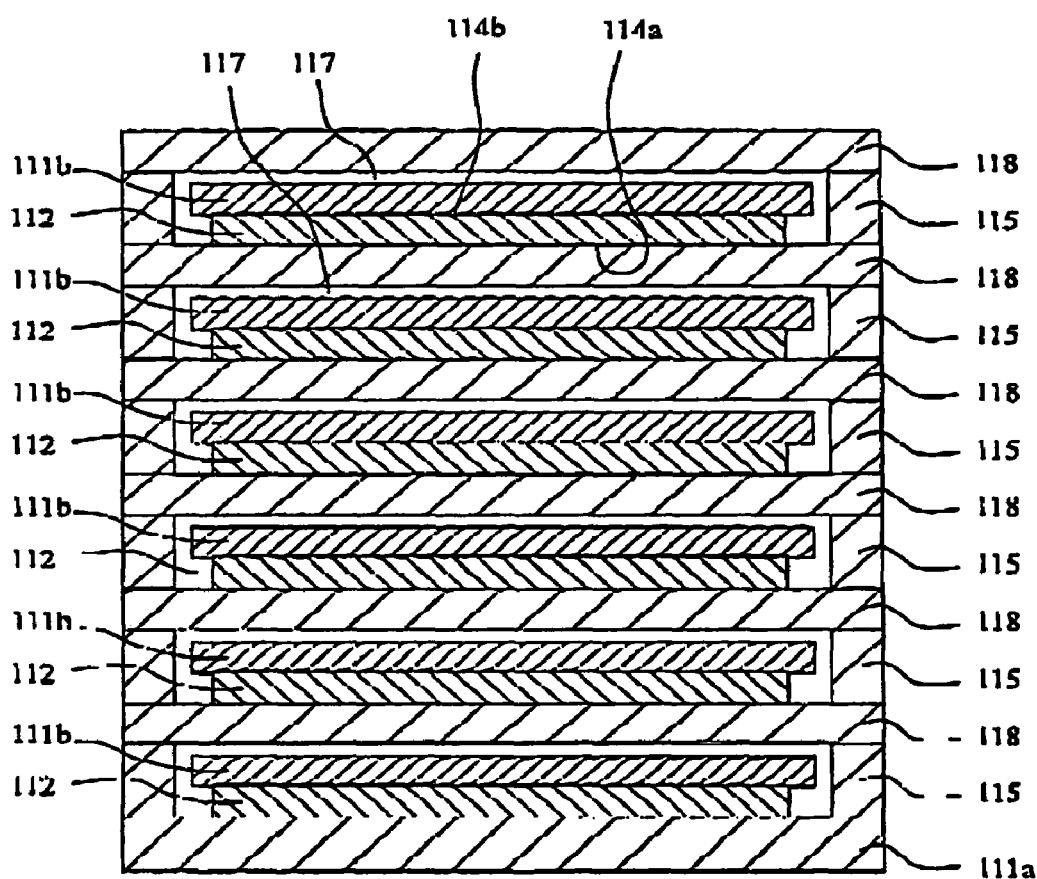
FIG. 2 is a schematic sectional view for explaining another method of manufacturing piezoelectric ceramics in the first embodiment of the present invention.

In case a plurality of green compacts are fired, a plurality of green compacts may be disposed on a supporting member 101 having a large width, and also a plurality of firing jigs shown in FIG. 1(b) may be used in the state of being laminated one on another. Furthermore, as shown in FIG. 2, spacers 115 and supporting top plates 118, which serve as a supporting member and a top plate, are alternatively laminated on a supporting member 111a to form a plurality of sealed spaces 117, and then green compact 112 is disposed inside the sealed space and an upper supporting member 111b can also be disposed thereon.

Prior to firing of a green compact 102, it may be debinded at a temperature of about 400 to 900° C., if necessary. A surface electrode is formed on the surface of the resulting sintered body, followed by polarized thus making it possible to obtain an actuator.

As described above, when employing the method of manufacturing the piezoelectric ceramics of the present invention, deformation of the piezoelectric ceramics caused by variation in shrinkage during firing can be reduced even in case of manufacturing an actuator comprising a thin layer having a thickness of 100 μm or less. Therefore, residual stress produced when fixed to a supporting member such as flow passage member and the d constant of a lot of displacement elements constituting the actuator becomes uniform, thus making if possible to remarkably reduce variation in displacement. Also characteristics with higher speed and higher accuracy can be improved by applying the actuator to a printing head of an ink jet printer.

While the embodiment has been described with respect to the case of the piezoelectric actuator by way of example, the piezoelectric displacement element of the present invention can be applied to piezoelectric meters, for example, acceleration meter, knocking meter, AE meter or the like, fuel injector, printing head for ink jet printer, piezoelectric resonator, oscillator, ultrasonic motor, ultrasonic oscillator and filter, in addition to the piezoelectric actuator.

The actuator of the present invention comprises a piezoelectric substrate made of aforementioned piezoelectric ceramics, a plurality of surface electrodes provided on the surface of the piezoelectric substrate, and an internal electrode provided inside the piezoelectric substrate. As shown in FIG. 3(a), an actuator 1 comprises a piezoelectric substrate 2 made of piezoelectric ceramics, an internal electrode 5 provided inside the piezoelectric substrate 2 and a plurality of surface electrodes 6 provided on a portion of the surface of the piezoelectric layer 4 (piezoelectric vibration layer) formed on the surface portion of the piezoelectric substrate 2, the internal electrode 5 and the surface electrode 6.

In the actuator 1, as shown in FIG. 3(b), surface electrodes 6 are arranged two-dimensionally at regular intervals, each being independently connected to an external electronic circuit. When a voltage is applied between the electrodes, it is made possible to make a displacement of the piezoelectric vibration layer 4 at site interposed between the internal electrode 5 and surface electrodes 6 to which the voltage is applied. As described above, application of the respective displacement elements 7 to an independently controlled printing head makes it possible to contribute to realize higher speed and higher accuracy of the ink jet printer.

By setting the flatness of the surface of the piezoelectric substrate 2, i.e. flatness of the surface of the piezoelectric layer 4 to 20 μm or less, as shown in FIG. 3(c), even if the actuator 1 having flat surface of the present invention is bonded with a supporting member 3 provided with grooves 3a formed by partition walls 3b, the actuator 1 causes less deformation during bonding and residual stress can be reduced, and thus variation in characteristic per displacement element can be reduced.

The internal electrode 5 is preferably made of a material which contains at least Ag and has conductivity and the material includes, for example, Au, Ag, Pd, Cu, Al, or an alloy thereof. Among these materials, Ag is preferable in view of excellent sinterability, excellent conductivity and low cost. In case the piezoelectric ceramics contain Pb, Ag is preferably used as the material of the internal electrode 5 so as to decrease the firing temperature.

The thickness of the internal electrode 5 and surface electrode 6 must be set so that the electrodes have satisfactory conductivity without adversely affecting the displacement, and is preferably from 0.1 to 5 μm, more preferably from 0.5 to 5 μm, and most preferably from 1 to 2 μm. Particularly, the thickness of the internal electrode is preferably from about 1 to 3 μm and the thickness of the surface electrode is preferably from 0.2 to 0.5 μm.

As shown in FIG. 3(c), the printing head of the present invention comprises the supporting member 3 and the actuator 1 bonded to the surface of the supporting member. Inside the supporting member 3, a plurality of ink flow passages 3a are formed by partition walls 3b and ink can be discharged through ink nozzles 8 by compressing ink due to the displacement of the displacement element.

According to the present invention, there can be provided a printing head comprising several hundreds of displacement elements provided at small intervals, which shows less variation in displacement, resulting in uniform ink discharge characteristic.

The actuator comprising a piezoelectric substrate 2 made of piezoelectric ceramics, an internal electrode 5 provided inside the piezoelectric substrate 2 and a plurality of surface electrodes 6 provided on a portion of the surface of the piezoelectric substrate 2 can be manufactured by the method described in the following embodiment.

<Second Embodiment>

Now this embodiment will be described below in the case of using an actuator used for an ink jet printing head, by way of example.

Figure 4:
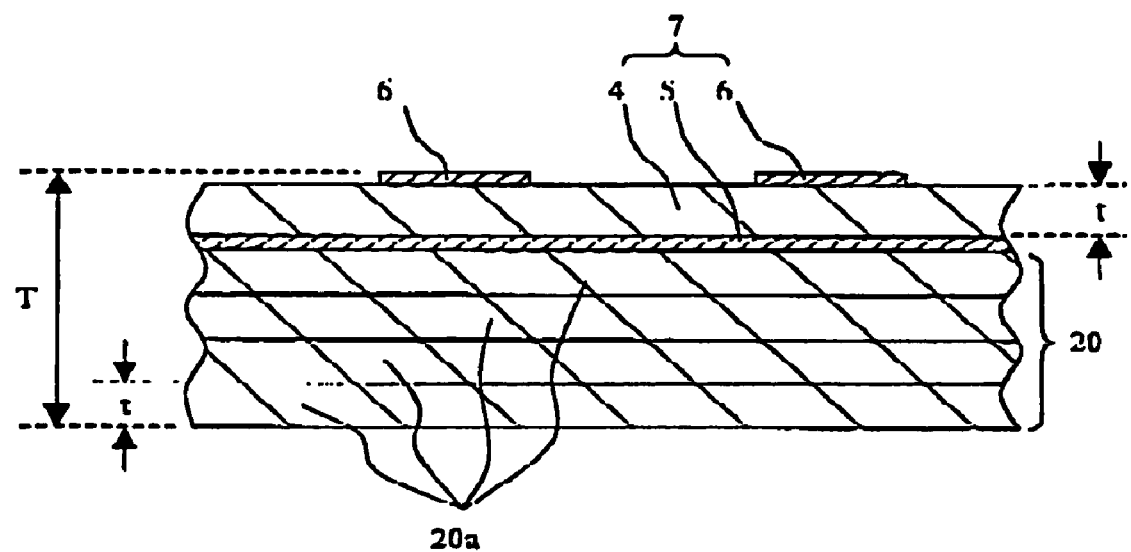
FIG. 4 is a schematic sectional view showing an actuator in the second embodiment of the present invention.

As shown FIG. 4, a laminated piezoelectric pile of the present invention is fabricated by providing a displacement element 7 on the surface of a piezoelectric substrate 20 comprising piezoelectric ceramics layers 20a laminated thereon so that a piezoelectric layer 4 is interposed between a common electrode 5 and an individual electrode 6, and a thickness of the entire laminated piezoelectric pile is denoted by the symbol T and a thickness of the respective piezoelectric ceramics layers 20a and the piezoelectric layer 4 is denoted by the symbol t.

In the laminated piezoelectric pile of the present invention, piezoelectric ceramics layers 20a are laminated and, for example, a plurality of displacement elements 7, each comprising a piezoelectric layer 4, a common electrode 5 and an individual electrode 6, are formed on the surface of a piezoelectric substrate 20 comprising four piezoelectric ceramics layers 20a laminated thereon. The thickness t of the respective piezoelectric ceramics layers and the piezoelectric layer is appropriately decided by the characteristic of the material to be used and the size of elements.

Specially, it is important that the thickness of the laminated piezoelectric pile, that is, the total thickness of the actuator is preferably 100 μm or less, more preferably 80 μm or less, and most preferably 60 μm or less, so as to obtain a large displacement. The piezoelectric substrate 20 and the piezoelectric layer 4 constitute a laminate because it becomes easier to incorporate an electric circuit into the laminated piezoelectric pile. It is important that the thickness t of the respective piezoelectric ceramics layers 20a and the piezoelectric layer 4, that constitute a laminate, is preferably set to 50 μm or less, more preferably 35 μm or less, and most preferably 20 μm or less. It is particularly preferable to control the thickness t to 20 μm or less and the thickness T to 60 μm or less so as to obtain excellent characteristic for actuator.

The smaller the thickness T of the laminated piezoelectric pile, the better in view of increase of the displacement. Since the mechanical strength and breakdown voltage are lowered when the thickness T decreases, the lower limit of the total thickness T of the actuator is preferably 10 µm or less, more preferably 15 µm or less, and most preferably 20 µm, so as to achieve sufficient mechanical strength to prevent breakage during handling and operation, and to endure applied voltage.

Also the lower limit of the thickness t is preferably 5 µm or less, and more preferably 7 µm or less, so as to achieve sufficient mechanical strength to prevent breakage during handling and operation, and to endure applied voltage. It is also preferable that variation in displacement and variation in thickness of the respective layers and total thickness are further improved and the thickness t is set in a range from 5 to 15 µm, and also the thickness T is set in range from 20 to 60 µm, which enables it to obtain the laminated piezoelectric element that shows stable displacement.

It is preferable that a lot of displacement elements 7 are formed on the surface of the piezoelectric substrate 20 and also regularly arranged, two-dimensionally, which enables it to achieve higher accuracy. It is important that in-plane variation in thickness of a plurality of displacement elements 7 is preferably 10% or less, more preferably 8% or less, and most preferably 6% or less.

It becomes possible to accuracy control a discharge amount of ink by controlling in-plane variation in thickness as described above, thus making it possible to realize a printing head and an ink jet printer, capable of printing with higher speed, higher resolution and higher accuracy.

As shown FIG. 4, in-plane variation in thickness as used herein does not average a difference between site provided with an individual electrode 6 and site provided with no individual electrode, but is determined by a comparison between sites provided with an individual electrode 6 and a comparison between sites provided with no individual electrode 6, and averages distribution of thickness that may be the same in view of design.

The piezoelectric layer 4 constituting the displacement element 7 is preferably made of a material having a perovskite crystal structure, such as lead zirconate titanate compound, lead titanate compound or barium titanate compound. Among these materials, a $PbZrTiO_3$ (PZT) compound is particularly preferable because it enables larger displacement. The piezoelectric layer 4 may be composed of a single layer or plural layers. The thickness of the individual electrode 6 and the common electrode 5 may be the same as in aforementioned embodiment.

With such a constitution, since in-plant variation in thickness of the laminated piezoelectric pile is suppressed, variation in displacement of a lot of displacement elements 7 constituting the laminated piezoelectric pile are suppressed, thus making it possible to manufacture a printing head shown in FIG. 2. Consequently, it is made possible to realize a printing head suitable for ink jet printing, that is less likely to cause non-uniform discharge and has high quality.

Variation in displacement is determined by the following procedure. That is, all displacement elements 7 are driven by successively applying a predetermined voltage and the displacement of each displacement element is measured, and then an average value is calculated. After determining a maximum difference between the respective measured data and an average, the maximum value is divided by the average value to obtain variation in displacement. The displacement of each displacement element 7 in the laminated piezoelectric pile is measured at random ten points using a laser Doppler vibrometer and a maximum difference between the respective measured data and an average displacement is divided by the average displacement, thus making it possible to evaluate variation in displacement.

Figure 5:
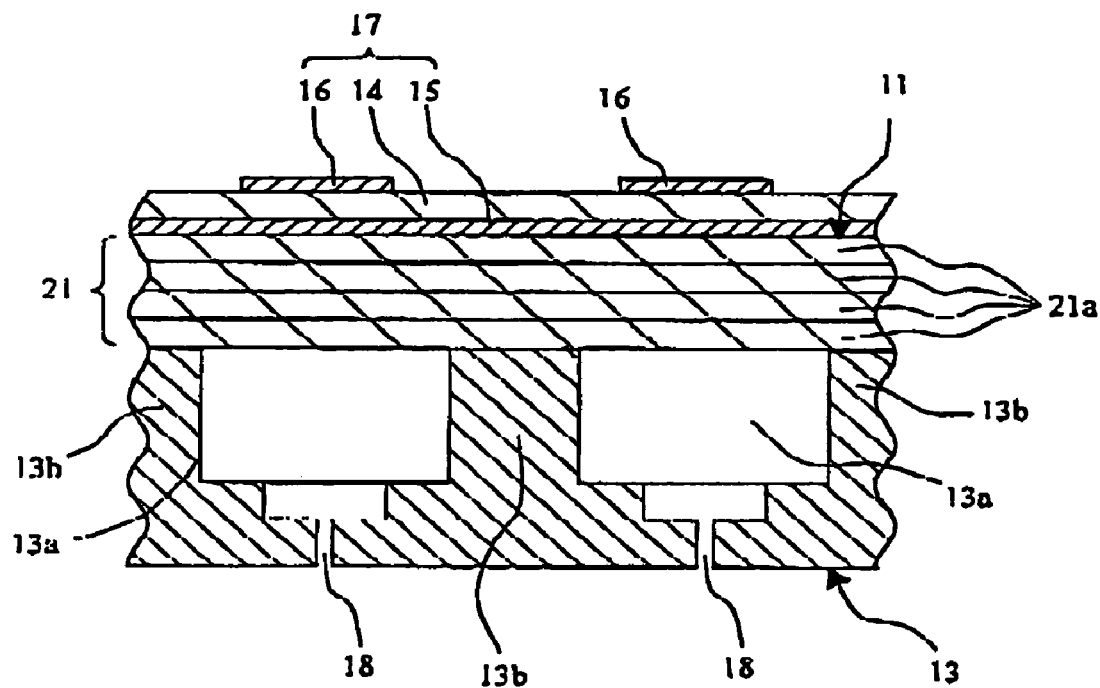
FIG. 5 is a schematic sectional view showing a structure of an ink jet printing head that employs the actuator shown in FIG. 4.

A printing head shown in FIG. 5 has such a structure that an actuator 11 is provided on a flow passage member 13 comprising a plurality of ink flow passages 13a composed of grooves and partition walls 13b that partition the ink flow passages 13a. The actuator 11 has such a structure that a displacement element 17 is disposed on a piezoelectric substrate 21 comprising piezoelectric ceramics layer 21a laminated one on another so that an individual electrode 16 is disposed right on the ink flow passages 13a.

Now the method of manufacturing the actuator (laminated piezoelectric pile) will be described below. First, it is important that an average grain size of a piezoelectric ceramic powder is preferably 1 µm or less, more preferably 0.7 µm or less, and most preferably 0.5 µm or less. By setting the average grain size to 1 µm or less, activity upon sintering is enhanced and the sintering temperature can be decreased. In case of the piezoelectric ceramics containing Pb, when the sintering temperature decreases, lead is evaporated and in-plane variation in composition is reduced, thus making it possible to reduce variation in displacement of the displacement element.

A stock material powder and an organic binder component are mixed to prepare a slurry for formation of a tape (mixing step). Then, a green sheet is formed by a general tape forming method such as roll coater method, slit coater method or doctor blade method using slurry for formation of a tape obtained in the mixing step (forming step).

It is important to press the green sheet obtained in the forming step (pressing step). As the pressing step, a known method can be employed. It is particularly preferable to employ a pressing method, plane pressing method or hydrostatic pressing method, which enables it to achieve uniform thickness. As described above, variation in thickness of the tape can be reduced by pressing the green sheet after forming. The dried tape include pores formed after evaporation of the slurry solvent and variation in thickness of the tape is caused depending on the size of pores. By collapsing the pores by pressing uniform tap is obtained and also variation in thickness is reduced.

The pressure during the pressing step varies depending on the composition of the material, the amount of the organic binder and the thickness of the green sheet, and is preferably from 10 to 100 Mpa, more preferably from 20 to 50 MPa, and most preferably from 30 to 40 MPa, so as to reduce variation in thickness of the green sheet, thereby to achieve uniform thickness and to increase green density.

When the temperature during the pressing step is too high, excess deformation due to pressing sometimes occurs. The temperature varies depending on the kind of the binder, but is 30° C. or lower, preferably 250° C. or lower, more preferably 200° C. or lower, and most preferably 150° C. or lower, so as to impart proper viscosity to the hinder and to remove pores. The lower limit of the temperature is 0° C., preferably 20° C., more preferably 35° C., and most preferably 50° C.

The surface of a mold to be pressed may be subjected to a surface treatment, or pressing may be conducted after disposing a release sheet on the surface of the tap. There can also be employed a pressure adjusting mechanism that enables uniform in-plane pressure.

Such a pressing treatment has not only the effect of removing pores but also the effect of increasing green density, and can increase the contact area between ceramic particles. As a result, the sintering rate increases and also the sintering temperature can be decreased because of fine particles. With regard to piezoelectric ceramics containing lead, it is made possible to suppress evaporation of lead during sintering and variation in composition, and thus making it possible to suppress variation in displacement.

It becomes easier to reduce variation in thickness of the laminate and variation in thickness of the sintered body by setting variation in thickness of the respective green sheets obtained in the pressing step to 15% or less, especially 10% or less.

Then, electrodes are formed on a portion of the green sheet obtained in the pressing step. That is, a common electrode and an individual electrode are formed by a known method such as printing method. If necessary, via holes and via conductors are formed to connect between electrodes.

The resulting green sheets (with or without electrodes, with via holes) are laminated with a desired layer configuration and then mutually adhered to obtain a laminated green compact (laminating step). Examples of the adhering method include a method of using a solution containing an adhesive component, a method of adhering by imparting adhesion to an organic binder component in the green sheet with heating, and a method of adhering only by pressing.

After an organic component in the laminated green compact obtained in the laminating step is optionally removed by a debinding treatment, the laminated green compact is fired in an oxygen atmosphere to obtain a laminated piezoelectric pile (laminating step).

As the method of removing the organic component, there can be employed a method of subjecting to a heat treatment using a temperature pattern suited for thermal decomposition behavior of the organic component to be removed. The firing atmosphere preferably has an oxygen content of 80% or higher, and more preferably 90% or higher. In case of firing piezoelectric ceramics containing Pb, an oxygen partial pressure increases by increasing the content of oxygen as a soluble gas, thereby to suppress decomposition and evaporation of lead and to decrease an internal pressure of pores, and thus formation of voids is suppressed by shrinkage of pores.

The use of the method comprising these steps makes it possible to suppress variation in composition and to reduce pores. Thus, a laminated piezoelectric pile made of a thin sintered body having a thickness of 100 μm or less with less in-plane variation in displacement can be provided and the resulting laminated piezoelectric pile can be used for a printing head of an ink jet printer.

<Third Embodiment>

Now the method of manufacturing the actuator of this embodiment will be described below in the case of using PZT as piezoelectric ceramics, by way of example. First, a PZT powder having purity of 99% and an average particle size of 1 μm or less is prepared as the material to make the piezoelectric ceramics.

A mixture of the PZT powder and an organic binder is formed into a tape and the tape is coated with an Ag—Pd paste that makes the internal electrode on a desired part thereof. Then, via holes are formed on a desired part thereof and electrodes are formed inside the via holes. The resulting green sheets are laminated one on another and optionally cut into a specific shape.

Figure 6:
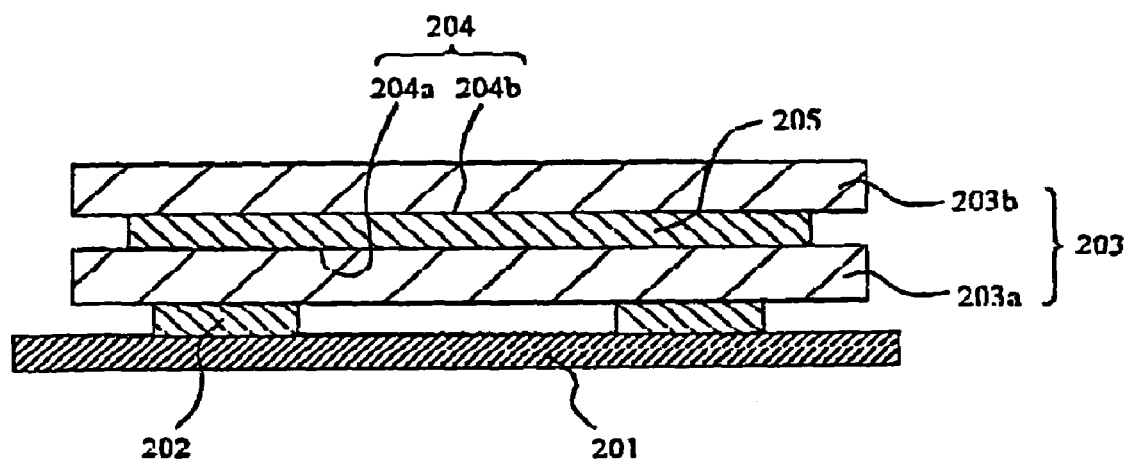
FIG. 6 is a schematic sectional view for explaining a method of manufacturing an actuator in the third embodiment of the present invention.

To fire the resulting green compact, the green compact is put in a firing furnace while being placed on a jig. An example of arrangement is shown in FIG. 6. A supporting member 203a is disposed on a setter 201 via a spacer 202 and a green compact 205 is disposed on the supporting member 203a, thereby contacting the supporting member 203, whose has porosity of 1% or less and flatness of 20 μm or less, with the green compact 205.

If the green compact 205 is disposed on the supporting member 203a, a member to be disposed on the green compact 205 is not limited and, for example, a porous material may be disposed. It is preferable that a supporting member 203b having the same surface as that of the supporting member 203a is placed while interposing the green compact 205 between a pair of supporting members 203a, 203b, whereby, variation in composition can be effectively suppressed and flatness of 20 μm or less can be easily achieved.

As the supporting members 203a, 203b, substantially the same supporting member as in the first embodiment is used.

Figure 7:
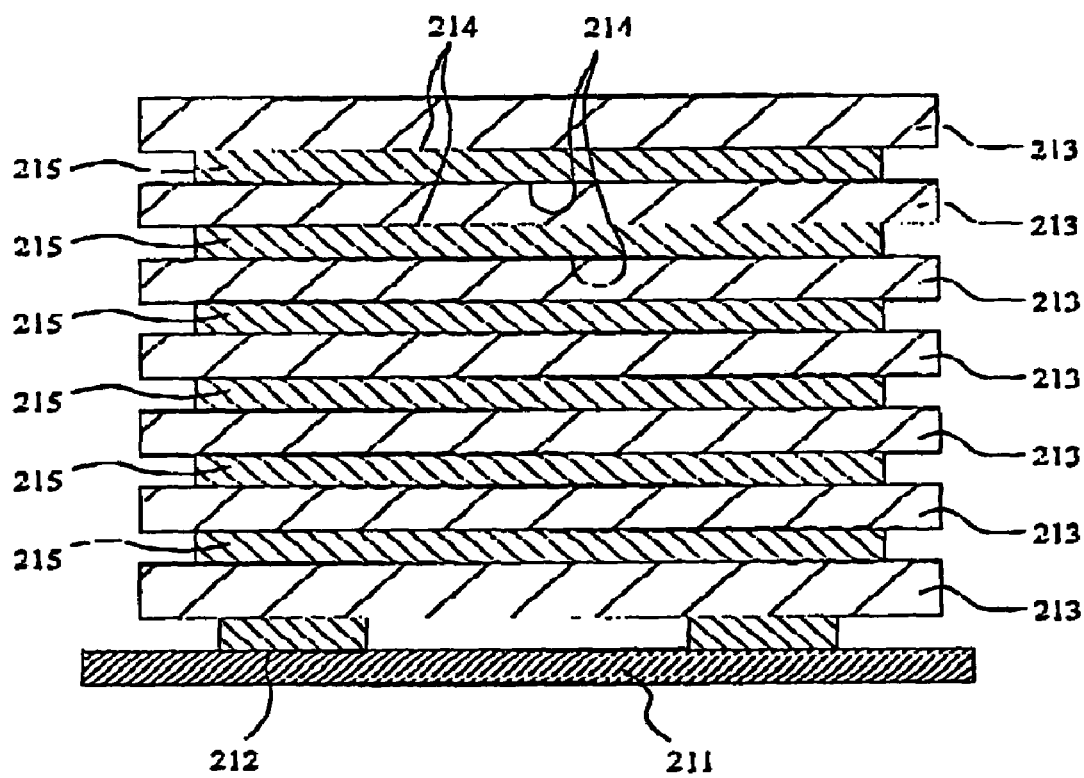
FIG. 7 is a schematic sectional view for explaining a method of manufacturing an actuator in the third embodiment of the present invention.

In case of firing a plurality of laminated green compacts, as shown in FIG. 7, a plurality of supporting members 213 and green compacts 215 are alternatively laminated on a setter 211 via a spacer 212. As the supporting member 213, substantially the same supporting member as in the first embodiment is used.

A surface electrode 6 is formed on the surface of the resulting sintered body, followed by polarization, thus making it possible to obtain an actuator.

When employing such a method, deformation of the piezoelectric ceramics caused by variation in shrinkage during firing can be reduced even in case of manufacturing an actuator comprising a thin layer having a thickness of 100 μm or less. Therefore, residual stress produced when fixed to a supporting member such as flow passage member and the d constant of a lot of displacement elements constituting the actuator becomes uniform, thus making it possible to remarkably reduce variation in displacement. Also characteristics with higher speed and higher accuracy can be improved by applying the actuator to a printer head of an ink jet printer.

The following examples further illustrate the manner in which the present invention can be practiced. It is understood, however, that the examples are for the purpose of illustration and the inventions are not to be regarded as limited to any of the specific materials or condition therein.

EXAMPLE I

First a powder of piezoelectric ceramic material containing lead zirconate titanate having purity of 99% or higher was prepared as the stock material. The piezoelectric ceramic powder containing lead zirconate titanate as a main component was mixed with butyl methacrylate used as an aqueous binder, ammonium polycarbonate used as a dispersant and isopropyl alcohol and water used as solvents, to obtain a slurry. The slurry was spread over a carrier film by a doctor blade method to form a green sheet having a thickness of about 30 μm.

Using powders of various piezoelectric ceramic materials, green sheets were formed in the same manner. Also a paste to form the internal electrode was prepared. The resulting paste was applied to the surface of the green sheet to a thickness 4 μm by printing, thereby forming an internal electrode. A green sheet with the side on which the internal electrode was printed facing upward was interposed between two green sheets without any internal electrode printed thereon, and pressed to obtain a laminated green compact.

The laminated green compact, after being debinded, was interposed between a pair of supporting members, as shown in FIG. 1(b), and a flame was disposed around the laminated green compact to form a sealed space. The laminated green compact was put in a firing furnace in this state.

In case the supporting member is made of zirconia, stabilization degree was determined. The stabilization degree indicates the proportion of a cubic crystal in the entire crystal phase. Specifically, peak intensity was measured by X-ray diffraction (XRD) and the stabilization degree was calculated from the following equation:

Stabilization degree=$100 \times Vm/Vc$ where Vm and Vn respectively denote a volume fraction of a monocline crystal and a volume fraction of a cubic crystal, and are represented by the following formulas:

$Vm=(lm(111)+lm(11-1))/(lm(111)+lm(11-1)+lt(111)+lc(111))$ $Vc=lc(400)/(lc(400)+lt(400)+lt(400))$ where l denotes an integrated intensity (peak intensity) of the respective reflection planes, and symbols m, t and c respectively denote a monocline crystal, a tetragon crystal and a cubic crystal.

The porosity of the supporting member was measured by image analysis of a microphotograph (magnification: ×200) of the mirror-polished surface. The flatness was determined by the following procedure. That is, a sample was scanned in a major axis direction of a jig and a direction perpendicular to the direction using a combined apparatus of a laser focus displacement meter and an X-Y stage (manufactured by KEYENCE CORPORATION) and a largest value among values obtained from a difference between a maximum value and a minimum value was taken as the flatness. The average grain size G was calculated by the equation:

$G=1.5 \times L$ where L denotes an average section length of a SEM microphotograph of a sample obtained by mirror-polishing and etching with boiling phosphoric acid.

With regard to volumes V1, V2 and V3 of the sealed space, upper supporting member and green compact, V1 and V2 were determined by an Archimedian method, V3 was determined by size of the green compact.

Surface flatness Ra of the surface of the supporting member was determined by the following procedure. That is, an area measuring 100 µm×100 µm was scanned using AFM and Ra was expressed by an average value of values measured at random five points in the surface.

It was confirmed by qualitative analysis using energy-dispersive X-ray microanalysis (EDS/EPMA) whether the surface of the supporting member contains Pb or not.

Piezoelectric ceramics comprising a piezoelectric layer and an internal electrode were manufactured by firing the green compact in an atmosphere containing 99% or more of oxygen at 1000° C. for samples Nos. I-1 to 54, 1130° C. for a sample No. I-55, and 1200° C. for samples Nos. I-56 to 58, for two hours.

For Sample No. 1-59, a spacer having a thickness of 600 µm was disposed on a porous supporting member and, after disposing the other porous supporting member thereon, a laminated green compact was disposed between upper and lower supporting members and then put in a firing furnace.

The resulting piezoelectric ceramics were evaluated in the following manner.

The thickness of the actuator was measured by a micrometer and the surface roughness Ra of the actuator was measured by a probe type surface roughness meter.

The surface unevenness was determined by the following procedure. That is, a sample was scanned in an area measuring 2 mm in length and 2 mm in width using a combined apparatus of a laser focus displacement meter and an X-Y stage, manufactured by KEYENCE CORPORATION, and then a difference between a maximum value and a minimum value was calculated and taken as the surface unevenness.

The flatness of the piezoelectric ceramics were determined by the following procedure. That is, a sample was scanned from one end to the other end using a combined apparatus of a laser focus displacement meter and an X-Y stage, and then a change in height was determined and taken as the flatness.

It was confirmed by qualitative analysis using EDS/EPMA whether the surface of the supporting member contains Ag or not.

Then a surface electrode was formed on one surface of the resulting piezoelectric ceramics by applying Ag paste using a screen printing method and firing at a temperature from 600 and 800° C. in air atmosphere. 600 points of the surface electrode were formed on one substrate.

The dielectric constant c was calculated by the thickness of the piezoelectric layer measured by a scanning electric microscope (SEM), the area of the surface electrode measured by a microscope manufactured by KEYENCE CORPORATION, and the electrostatic capacity at 1 kHz measured by an impedance analyzer (4194A, manufactured by Agilent Techologies).

Variation in dielectric constant was determined by the following procedure. That is, the dielectric constant of all surface electrodes was measured, and then Cva ($\sigma$/Av) was calculated was dispersion ($\sigma$) and an average value (Av) and the resulting value (%) is taken as variation in dielectric constant.

The piezoelectric constant was determined by the following procedure. That is, $d_{31}$ was measured at ten points by a resonance method using an impedance analyzer (4194A, manufactured by Agilent Technologies) and its average value was calculated. Then a difference between the respective measured values of $d_{31}$ and the average value was calculated and the maximum value was divided by the average value an the resulting value (%) was taken as variation in $d_{31}$.

Figure 8:
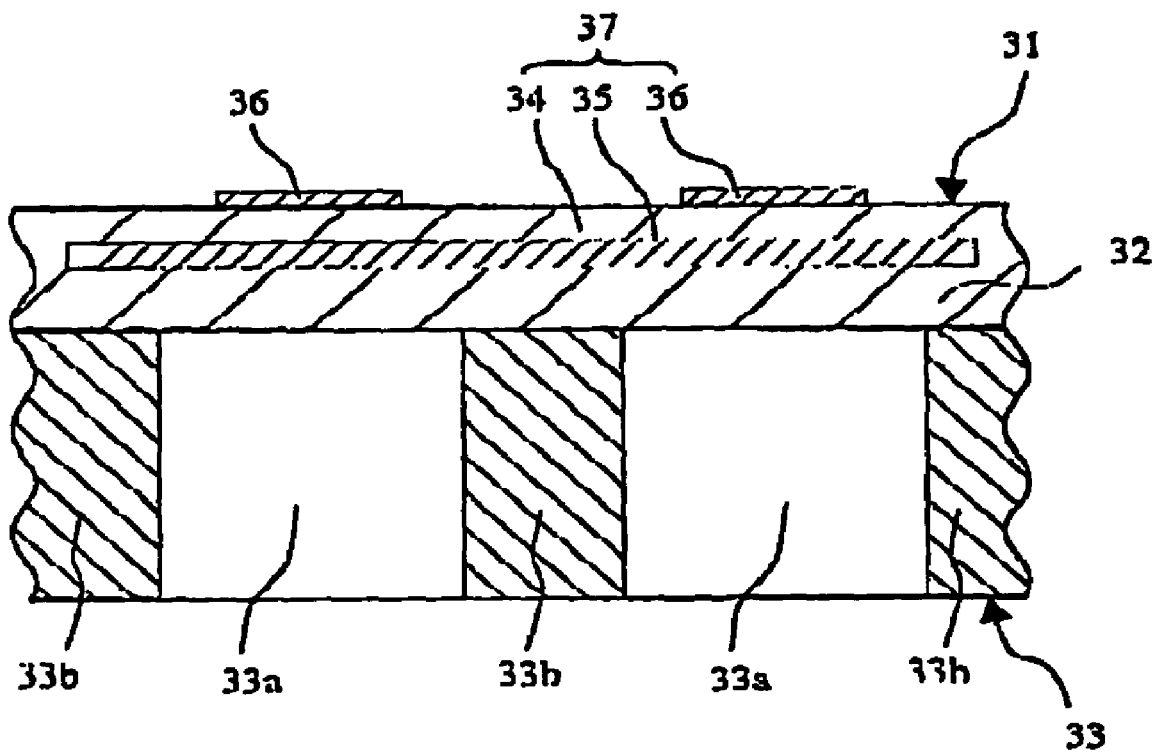
FIG. 8 is a schematic sectional view showing an actuator bonded with a supporting substrate used in examples.

Displacement was measured using a displacement element 37 shown in FIG. 8, that was made so that the actuator 31 obtained above is bonded with supporting member 33 comprising grooves 33a and partition walls 33b, a piezoelectric vibration layer 34 being interposed between an internal electrode 35 and surface electrodes 36. The actuator was irradiated with laser beam on the side of a supporting substrate 33 through the groove 33a by means of a laser Doppler displacement meter, so as to measure displacement at the center and seven points along the periphery of the groove 33a of the supporting substrate 33, and the displacement were averaged. The results are shown in Table 1 and Table 2.

TABLE 1

| Sample No. | Supporting member | | | | | | | | | | | | | Piezoelectric Ceramics | | | | | | Variation of D electric Constant % | Piezoelectric Constant | | Displacement (nm) |
| | Main Component | Sub-component | Stabilization Degree | Porosity % | Flatness μm | G μm | $V_1$ mm³ | $V_2$ mm³ | $V_3$ mm³ | $V_1/(V_2+V_3)$ | $V_2/V_3$ | Ra μm | Existence of Pb | Main Component | Thickness μm | Flatness μm | Unevenness μm | Ra μm | C Content wt % | Existence of Ag | | Mean pm/V | Variation % | |
|---|---|---|---|---|---|---|---|---|---|---|---|---|---|---|---|---|---|---|---|---|---|---|---|---|
| I-1 | ZrO₂ | CaO | 100 | 0.5 | 10 | 20 | 1326 | 625 | 75 | 1.894 | 17.68 | 0.4 | Yes | Pb, Zr, Ti | 50 | 3 | 2 | 0.5 | 0.07 | Yes | 2 | 251 | 3 | 71 |
| I-2 | ZrO₂ | CaO | 100 | 1 | 10 | 20 | 1326 | 625 | 75 | 1.894 | 17.68 | 0.4 | Yes | Pb, Zr, Ti | 50 | 5 | 2 | 0.6 | 0.07 | Yes | 2 | 252 | 5 | 72 |
| I-3 | ZrO₂ | CaO | 100 | 3 | 10 | 20 | 1326 | 625 | 75 | 1.894 | 17.68 | 0.4 | Yes | Pb, Zr, Ti | 50 | 7 | 2 | 0.6 | 0.07 | Yes | 2 | 251 | 4 | 70 |
| I-4 | ZrO₂ | CaO | 100 | 5 | 10 | 20 | 1326 | 625 | 75 | 1.894 | 17.68 | 0.4 | Yes | Pb, Zr, Ti | 50 | 15 | 2 | 0.6 | 0.07 | Yes | 3 | 251 | 6 | 71 |
| * I-5 | ZrO₂ | CaO | 100 | 7 | 10 | 20 | 1326 | 625 | 75 | 1.894 | 17.68 | 0.4 | Yes | Pb, Zr, Ti | 50 | 25 | 7 | 5 | 0.07 | Yes | 7 | 251 | 12 | 72 |
| I-6 | ZrO₂ | CaO | 100 | 3 | 5 | 20 | 1326 | 625 | 75 | 1.894 | 17.68 | 0.4 | Yes | Pb, Zr, Ti | 50 | 3 | 2 | 0.6 | 0.07 | Yes | 2 | 250 | 4 | 72 |
| I-7 | ZrO₂ | CaO | 100 | 3 | 10 | 20 | 1326 | 625 | 75 | 1.894 | 17.68 | 0.4 | Yes | Pb, Zr, Ti | 50 | 5 | 2 | 0.6 | 0.07 | Yes | 2 | 253 | 3 | 73 |
| I-8 | ZrO₂ | CaO | 100 | 3 | 15 | 20 | 1326 | 625 | 75 | 1.894 | 17.68 | 0.4 | Yes | Pb, Zr, Ti | 50 | 11 | 2 | 0.6 | 0.06 | Yes | 4 | 250 | 5 | 74 |
| I-9 | ZrO₂ | CaO | 100 | 3 | 20 | 20 | 1326 | 625 | 75 | 1.894 | 17.68 | 0.4 | Yes | Pb, Zr, Ti | 50 | 17 | 2 | 0.6 | 0.07 | Yes | 5 | 251 | 7 | 71 |
| * I-10 | ZrO₂ | CaO | 100 | 3 | 30 | 20 | 1326 | 625 | 75 | 1.894 | 17.68 | 0.4 | Yes | Pb, Zr, Ti | 50 | 26 | 6 | 7 | 0.07 | Yes | 8 | 250 | 14 | 72 |
| I-11 | ZrO₂ | CaO | 100 | 3 | 10 | 20 | 1326 | 625 | 75 | 1.894 | 17.68 | 0.1 | Yes | Pb, Zr, Ti | 50 | 3 | 3 | 0.6 | 0.06 | Yes | 2 | 253 | 3 | 71 |
| I-12 | ZrO₂ | CaO | 100 | 3 | 10 | 20 | 1326 | 625 | 75 | 1.894 | 17.68 | 0.4 | Yes | Pb, Zr, Ti | 50 | 3 | 2 | 0.6 | 0.07 | Yes | 3 | 252 | 4 | 72 |
| I-13 | ZrO₂ | CaO | 100 | 3 | 10 | 20 | 1326 | 625 | 75 | 1.894 | 17.68 | 0.8 | Yes | Pb, Zr, Ti | 50 | 5 | 3 | 0.6 | 0.07 | Yes | 4 | 256 | 3 | 71 |
| I-14 | ZrO₂ | CaO | 100 | 3 | 10 | 20 | 1326 | 625 | 75 | 1.894 | 17.68 | 0.9 | Yes | Pb, Zr, Ti | 50 | 7 | 2 | 0.6 | 0.07 | Yes | 4 | 257 | 3 | 73 |
| I-15 | ZrO₂ | CaO | 100 | 3 | 10 | 20 | 1326 | 625 | 75 | 1.894 | 17.68 | 1 | Yes | Pb, Zr, Ti | 50 | 10 | 3 | 0.6 | 0.07 | Yes | 4 | 253 | 3 | 71 |
| I-16 | ZrO₂ | CaO | 100 | 3 | 10 | 20 | 1326 | 625 | 75 | 1.894 | 17.68 | 3 | Yes | Pb, Zr, Ti | 50 | 12 | 2 | 0.6 | 0.07 | Yes | 7 | 241 | 10 | 72 |
| I-17 | ZrO₂ | CaO | 95 | 3 | 10 | 20 | 1326 | 625 | 75 | 1.894 | 17.68 | 0.4 | Yes | Pb, Zr, Ti | 50 | 3 | 2 | 0.6 | 0.07 | Yes | 5 | 243 | 9 | 71 |
| I-18 | ZrO₂ | CaO | 97 | 3 | 10 | 20 | 1326 | 625 | 75 | 1.894 | 17.68 | 0.4 | Yes | Pb, Zr, Ti | 50 | 3 | 2 | 0.6 | 0.07 | Yes | 4 | 250 | 8 | 71 |
| I-19 | ZrO₂ | CaO | 99 | 3 | 10 | 20 | 1326 | 625 | 75 | 1.894 | 17.68 | 0.4 | Yes | Pb, Zr, Ti | 50 | 3 | 3 | 0.6 | 0.07 | Yes | 3 | 253 | 3 | 72 |
| I-20 | ZrO₂ | MgO | 100 | 3 | 10 | 20 | 1326 | 625 | 75 | 1.894 | 17.68 | 0.4 | Yes | Pb, Zr, Ti | 50 | 3 | 2 | 0.6 | 0.07 | Yes | 2 | 252 | 3 | 70 |
| I-21 | ZrO₂ | Y₂O₃ | 100 | 3 | 10 | 20 | 1326 | 625 | 75 | 1.894 | 17.68 | 0.4 | Yes | Pb, Zr, Ti | 50 | 3 | 3 | 0.6 | 0.07 | Yes | 2 | 258 | 3 | 71 |
| I-22 | ZrO₂ | Yb₂O₃ | 100 | 3 | 10 | 20 | 1326 | 625 | 75 | 1.894 | 17.68 | 0.4 | Yes | Pb, Zr, Ti | 50 | 3 | 2 | 0.6 | 0.07 | Yes | 3 | 257 | 2 | 70 |
| I-23 | ZrO₂ | Dy₂O₃ | 100 | 3 | 10 | 20 | 1326 | 625 | 75 | 1.894 | 17.68 | 0.4 | Yes | Pb, Zr, Ti | 50 | 3 | 2 | 0.6 | 0.06 | Yes | 4 | 253 | 3 | 72 |
| I-24 | ZrO₂ | CaO | 100 | 3 | 10 | 20 | 1326 | 625 | 75 | 1.894 | 17.68 | 0.4 | Yes | Pb, Zr, Ti | 50 | 3 | 3 | 0.6 | 0.07 | Yes | 2 | 254 | 3 | 72 |
| I-25 | ZrO₂ | Sc₂O₃ | 100 | 3 | 10 | 20 | 1326 | 625 | 75 | 1.894 | 17.68 | 0.4 | Yes | Pb, Zr, Ti | 50 | 3 | 3 | 0.6 | 0.07 | Yes | 3 | 255 | 3 | 71 |
| I-26 | ZrO₂ | La₂O₃ | 100 | 3 | 10 | 20 | 1326 | 625 | 75 | 1.894 | 17.68 | 0.4 | Yes | Pb, Zr, Ti | 50 | 3 | 2 | 0.6 | 0.07 | Yes | 2 | 253 | 2 | 72 |
| I-27 | ZrO₂ | Gc₂O₃ | 100 | 3 | 10 | 20 | 1326 | 625 | 75 | 1.894 | 17.68 | 0.4 | Yes | Pb, Zr, Ti | 50 | 3 | 3 | 0.6 | 0.07 | Yes | 3 | 254 | 3 | 71 |
| I-28 | ZrO₂ | Sm₂O₃ | 100 | 3 | 10 | 20 | 1326 | 625 | 75 | 1.894 | 17.68 | 0.4 | Yes | Pb, Zr, Ti | 50 | 3 | 3 | 0.6 | 0.07 | Yes | 2 | 256 | 3 | 72 |
| I-29 | ZrO₂ | Lu₂O₃ | 100 | 3 | 10 | 20 | 1326 | 625 | 75 | 1.894 | 17.68 | 0.4 | Yes | Pb, Zr, Ti | 50 | 3 | 2 | 0.6 | 0.07 | Yes | 2 | 253 | 2 | 73 |
| I-30 | ZrO₂ | CaO | 100 | 3 | 10 | 20 | 1326 | 1250.8674 | 75 | 1.0001 | 17.68 | 0.4 | Yes | Pb, Zr, Ti | 50 | 3 | 2 | 0.6 | 0.07 | Yes | 2 | 254 | 2 | 71 |
| I-31 | ZrO₂ | CaO | 100 | 3 | 10 | 20 | 1326 | 586 | 75 | 2.0000 | 17.68 | 0.4 | Yes | Pb, Zr, Ti | 50 | 3 | 2 | 0.6 | 0.07 | Yes | 2 | 253 | 3 | 72 |
| I-32 | ZrO₂ | CaO | 100 | 3 | 10 | 20 | 1326 | 367 | 75 | 3.0000 | 17.68 | 0.4 | Yes | | | | | | | | | | | |
| I-33 | ZrO₂ | CaO | 100 | 3 | 10 | 20 | 1326 | 258.5 | 75 | 4.0000 | 17.68 | 0.4 | Yes | | | | | | | | | | | |

TABLE 1-continued

| | | | | | | | | | | | |
|---|---|---|---|---|---|---|---|---|---|---|---|
| I-32 | Pb, Zr, Ti | 50 | 3 | 2 | 0.6 | 0.07 | Yes | 4 | 250 | 4 | 71 |
| I-33 | Pb, Zr, Ti | 50 | 3 | 2 | 0.6 | 0.07 | Yes | 5 | 248 | 9 | 71 |

Sample numbers marked with * are not within the scope of the present invention.

TABLE 2

| | Supporting member | | | | | | | | | | | | |
|---|---|---|---|---|---|---|---|---|---|---|---|---|---|
| Sample No. | Main Component | Sub-component | Stabilization Degree | Porosity % | Flatness μm | G μm | $V_1$ mm³ | $V_2$ mm³ | $V_3$ mm³ | $V_1/(V_2 + V_3)$ | $V_2/V_3$ | Ra μm | Existence of Pb |
| I-34 | $ZrO_2$ | CaO | 100 | 3 | 10 | 20 | 1326 | 20 | 1000 | 1.300 | 0.02 | 0.4 | Yes |
| I-35 | $ZrO_2$ | CaO | 100 | 3 | 10 | 20 | 1326 | 600 | 600 | 1.105 | 1 | 0.4 | Yes |
| I-36 | $ZrO_2$ | CaO | 100 | 3 | 10 | 20 | 1326 | 1000 | 100 | 1.205 | 10 | 0.4 | Yes |
| I-37 | $ZrO_2$ | CaO | 100 | 3 | 10 | 20 | 1326 | 1250 | 25 | 1.040 | 50 | 0.4 | Yes |
| I-38 | $ZrO_2$ | CaO | 100 | 3 | 10 | 20 | 1326 | 1150 | 11.5 | 1.142 | 100 | 0.4 | Yes |
| I-39 | $ZrO_2$ | CaO | 100 | 3 | 10 | 20 | 1326 | 1500 | 6.5 | 1.015 | 200 | 0.4 | Yes |
| I-40 | $ZrO_2$ | CaO | 100 | 3 | 10 | 20 | 1326 | 625 | 75 | 1.894 | 17.68 | 0.4 | Yes |
| I-41 | $ZrO_2$ | CaO | 100 | 3 | 10 | 20 | 1326 | 625 | 75 | 1.894 | 17.68 | 0.4 | Yes |
| I-42 | $ZrO_2$ | CaO | 100 | 3 | 10 | 20 | 1326 | 625 | 75 | 1.894 | 17.68 | 0.4 | Yes |
| I-43 | $ZrO_2$ | CaO | 100 | 3 | 10 | 20 | 1326 | 625 | 75 | 1.894 | 17.68 | 0.4 | Yes |
| I-44 | $ZrO_2$ | CaO | 100 | 3 | 10 | 20 | 1326 | 625 | 75 | 1.894 | 17.68 | 0.4 | Yes |
| * I-45 | $ZrO_2$ | CaO | 100 | 3 | 10 | 20 | 1326 | 625 | 75 | 1.894 | 17.68 | 0.4 | Yes |
| I-46 | $ZrO_4$ | CaO | 100 | 3 | 10 | 5 | 1326 | 625 | 75 | 1.894 | 17.68 | 0.4 | Yes |
| I-47 | $ZrO_5$ | CaO | 100 | 3 | 10 | 15 | 1326 | 625 | 75 | 1.894 | 17.68 | 0.4 | Yes |
| I-48 | $ZrO_6$ | CaO | 100 | 3 | 10 | 30 | 1326 | 625 | 75 | 1.894 | 17.68 | 0.4 | Yes |
| I-49 | $Al_2O_3$ | — | 100 | 3 | 10 | 20 | 1326 | 625 | 75 | 1.894 | 17.68 | 0.4 | Yes |
| I-50 | BeO | — | 100 | 3 | 10 | 20 | 1326 | 625 | 75 | 1.894 | 17.68 | 0.4 | Yes |
| I-51 | MgO | — | 100 | 3 | 10 | 20 | 1326 | 625 | 75 | 1.894 | 17.68 | 0.4 | Yes |
| I-52 | Mullite | — | 100 | 3 | 10 | 20 | 1326 | 625 | 75 | 1.894 | 17.68 | 0.4 | Yes |
| I-53 | Spinel | — | 100 | 3 | 10 | 20 | 1326 | 625 | 75 | 1.894 | 17.68 | 0.4 | Yes |
| I-54 | FZT | — | 100 | 3 | 10 | 20 | 1326 | 625 | 75 | 1.894 | 17.68 | 0.4 | Yes |
| I-55 | Bi-type | — | 100 | 3 | 10 | 20 | 1326 | 625 | 75 | 1.894 | 17.68 | 0.4 | — |
| I-56 | WB | — | 100 | 3 | 10 | 20 | 1326 | 625 | 75 | 1.894 | 17.68 | 0.4 | — |
| I-57 | Nb-type | — | 100 | 3 | 10 | 20 | 1326 | 625 | 75 | 1.894 | 17.68 | 0.4 | — |
| I-58 | Ta-type | — | 100 | 3 | 10 | 20 | 1326 | 625 | 75 | 1.894 | 17.68 | 0.4 | — |
| * I-59 | Ta-type | — | 100 | 30 | 10 | — | — | — | 75 | — | — | 3 | — |

| | Piezoelectric Ceramics | | | | | | Variation of D electric | Piezoelectric Constant | | |
|---|---|---|---|---|---|---|---|---|---|---|
| Sample No. | Main Component | Thickness μm | Flatness μm | Unevenness μm | Ra μm | C Content wt % | Existence of Ag | Constant % | Mean pm/V | Variation % | Displacement (nm) |
| I-34 | Pb, Zr, Ti | 50 | 3 | 3 | 0.6 | 0.07 | Yes | 4 | 250 | 7 | 72 |
| I-35 | Pb, Zr, Ti | 50 | 3 | 2 | 0.6 | 0.07 | Yes | 3 | 249 | 4 | 71 |
| I-36 | Pb, Zr, Ti | 50 | 3 | 2 | 0.6 | 0.07 | Yes | 2 | 251 | 3 | 72 |
| I-37 | Pb, Zr, Ti | 50 | 3 | 2 | 0.6 | 0.07 | Yes | 4 | 252 | 4 | 73 |
| I-38 | Pb, Zr, Ti | 50 | 3 | 2 | 0.6 | 0.07 | Yes | 4 | 251 | 6 | 71 |
| I-39 | Pb, Zr, Ti | 50 | 3 | 3 | 0.6 | 0.07 | Yes | 5 | 250 | 9 | 72 |
| I-40 | Pb, Zr, Ti | 40 | 3 | 2 | 0.6 | 0.05 | Yes | 2 | 250 | 3 | 72 |
| I-41 | Pb, Zr, Ti | 50 | 3 | 2 | 0.6 | 0.07 | Yes | 2 | 252 | 4 | 71 |
| I-42 | Pb, Zr, Ti | 60 | 3 | 2 | 0.6 | 0.07 | Yes | 2 | 253 | 3 | 67 |
| I-43 | Pb, Zr, Ti | 80 | 3 | 2 | 0.6 | 0.05 | Yes | 2 | 252 | 5 | 61 |
| I-44 | Pb, Zr, Ti | 100 | 3 | 2 | 0.6 | 0.07 | Yes | 2 | 250 | 4 | 50 |
| * I-45 | Pb, Zr, Ti | 1000 | 3 | 2 | 0.6 | 0.07 | Yes | 2 | 250 | 3 | 20 |
| I-46 | Pb, Zr, Ti | 50 | 3 | 2 | 0.6 | 0.06 | Yes | 2 | 251 | 5 | 71 |
| I-47 | Pb, Zr, Ti | 50 | 3 | 2 | 0.6 | 0.06 | Yes | 2 | 252 | 4 | 72 |
| I-48 | Pb, Zr, Ti | 50 | 3 | 2 | 0.6 | 0.07 | Yes | 2 | 251 | 4 | 72 |
| I-49 | Pb, Zr, Ti | 50 | 3 | 2 | 0.6 | 0.07 | Yes | 4 | 241 | 9 | 70 |
| I-50 | Pb, Zr, Ti | 50 | 3 | 2 | 0.6 | 0.07 | Yes | 4 | 239 | 8 | 70 |
| I-51 | Pb, Zr, Ti | 50 | 3 | 2 | 0.6 | 0.07 | Yes | 4 | 249 | 8 | 71 |
| I-52 | Pb, Zr, Ti | 50 | 3 | 2 | 0.6 | 0.07 | Yes | 4 | 235 | 8 | 71 |
| I-53 | Pb, Zr, Ti | 50 | 3 | 2 | 0.6 | 0.07 | Yes | 2 | 251 | 3 | 72 |
| I-54 | Pb, Zr, Ti | 50 | 3 | 2 | 0.6 | 0.07 | Yes | 2 | 255 | 2 | 71 |
| I-55 | Bi, Zi, Nb | 50 | 3 | 2 | 0.6 | 0.07 | Yes | 2 | 180 | 2 | 56 |
| I-56 | AEM, AM, Nb, Ti | 50 | 3 | 2 | 0.6 | 0.07 | Yes | 2 | 200 | 3 | 62 |
| I-57 | AEM, AM, Nb | 50 | 3 | 2 | 0.6 | 0.07 | Yes | 2 | 210 | 3 | 66 |

TABLE 2-continued

| | | | | | | | | | | | |
|---|---|---|---|---|---|---|---|---|---|---|---|
| I-58 | AEM, AM, Ta | 50 | 3 | 2 | 0.6 | 0.07 | Yes | 2 | 209 | 3 | 65 |
| * I-59 | AEM, AM, Ta | 50 | 50 | 100 | 15 | 0.07 | Yes | 20 | 192 | 30 | 62 |

Sample numbers marked with * are not within the scope of the present invention.
Bi-type: Bismuth layer-structured compound
WB: Tungesten bronze
AM: Alkali metal
AEM: Alkaline-earth metal Samples Nos. I-1 to 4, I-6 to 9, 1-11 t 44 and I-46 to 59 for which $PbZrTiO_3$ (PZT) was used as a main component of the piezoelectric magnetic material showed variation in $d_{31}$ of 10% or less and displacement of 70 nm or more because.

Sample No. I-5, shows large variation in dielectric constant of 7% because a firing jig comprising a supporting member having large porosity of 6.5% was used, showed significant variation in $d_{31}$ of 12%. Sample No. 1-10, that shows large variation in dielectric constant of 8% because a firing jig comprising a supporting member having large flatness of 30 μm was used, showed significant variation in $d_{31}$ of 14%.

Sample No. I-45 having a large total thickness of 1000 μm (1 mm) showed very low displacement characteristic with a low displacement of 20 nm.

EXAMPLE II

Figure 3:
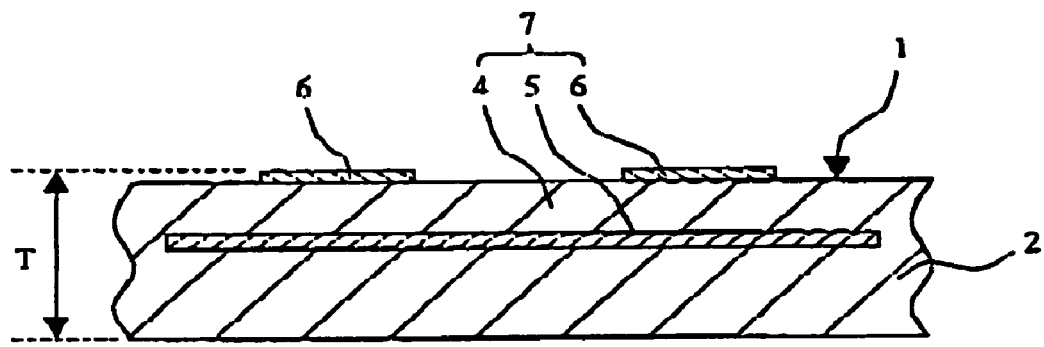
FIG. 3(a), FIG. 3(b) and FIG. 3(c) are respectively a schematic sectional view showing an actuator of the present invention, a schematic plan view showing sectional view showing and a schematic sectional view showing an actuator bonded with a supporting substrate.
Figure 3:
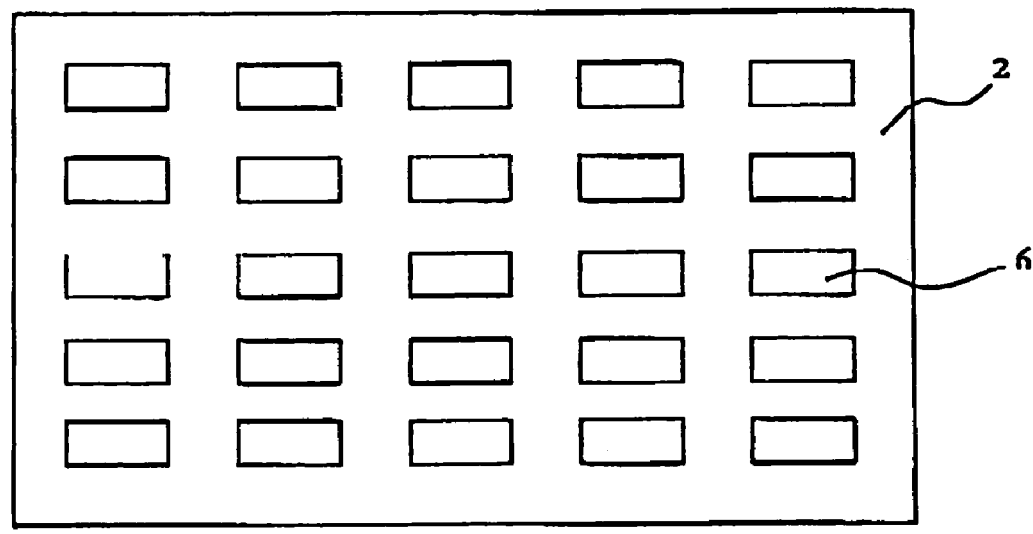
Figure 3:
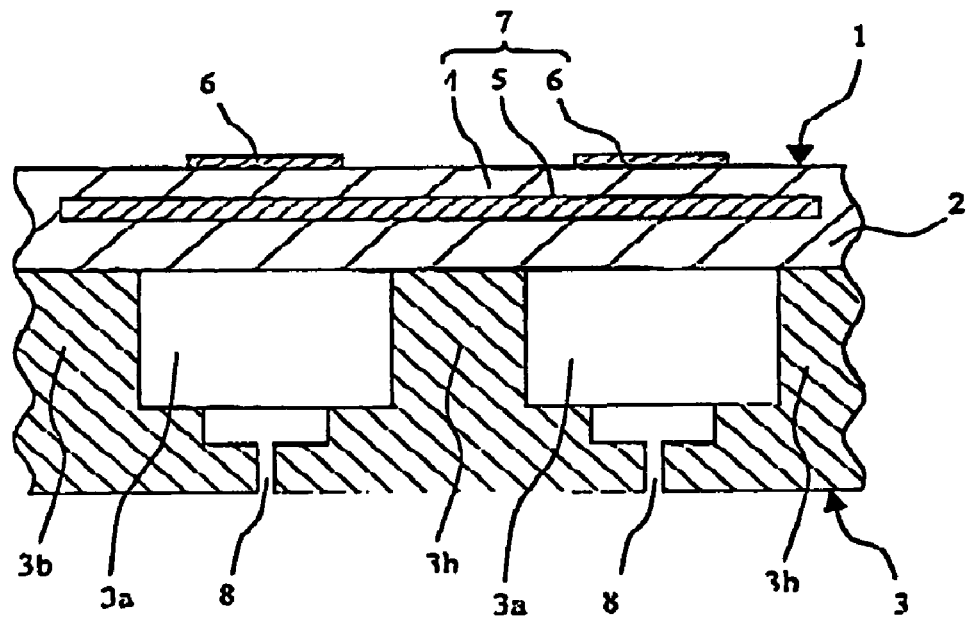

A lead zirconate titanate powder having a gain size (D50: average grain size of powder) shown in FIG. 3 was prepared as a piezoelectric ceramic powder and then mixed with an aqueous acryl solution to prepare a slurry (mixing step).

The slurry obtained in the mixing step was formed into a green sheet having a thickness of 20 μm using a roll coater method (forming step). Then, the green sheet obtained in the forming step was pressed under the pressing conditions shown in Table 1 using a roll pressing method, plane pressing method or hydrostatic pressing method (pressing step).

On the green sheet obtained in the pressing step, an internal electrode (common electrode) having a thickness of 5 μm and a surface electrode (individual electrode) having a thickness of 5 μm were formed by a printing method using Ag-Pd electrode paste (Ag:Pd=70:30). The green sheet with the surface electrode formed theron, as an upper layer, and the green sheet with the surface electrode formed thereon, as a lower layer, were laminated according to the layer configuration shown in FIG. 4 and then pressed under a pressure of 15 Mpa to obtain a laminated green compact (laminating step).

Finally, the resulting laminated green compact was dehinded in an air at 450° C. for five hours and then fired in an oxygen atmosphere at the temperature shown in Table 3 for two hours to obtain a laminated piezoelectric pile (firing step).

The thickness of the respective layers and the total thickness of the laminated green compact were measured by a microphotograph of a cross section of the resulting laminated piezoelectric pile taken by a scanning electron scope (SEM). To examine in-plane variation in thickness of the laminated green compact, the thickness was measured at random twenty points. An values measured at twenty points was averaged and a difference between a maximum value and a minimum value was calculated and a largest value among values obtained from a difference between a maximum value and a minimum value was taken as variation. The results are shown in Table 3.

$d_{31}$ of the actuator was determined in the same manner as in Example 1.

The results are shown in Table 3.

TABLE 3

| | Process | | | | | | | t | T | | $d_{31}$ | |
|---|---|---|---|---|---|---|---|---|---|---|---|---|
| | Material | Sheet | | Pressing | | Firing | | | | | Evaluation | |
| Sample No. | Diameter μm | Thickness μm | Method | Pressure MPa | Temperature ° C. | Temperature ° C. | $O_2$ % | Mean μm | Mean μm | Variation % | Mean pm/V | Variation % |
| II-1 | 0.3 | 20 | R | 40 | 100 | 1100 | 90 | 10 | 50 | 5 | 228 | 7 |
| II-2 | 0.5 | 20 | R | 40 | 100 | 1100 | 90 | 10 | 50 | 8 | 225 | 8 |
| II-3 | 0.7 | 20 | R | 40 | 100 | 1100 | 90 | 10 | 50 | 6 | 218 | 8 |
| II-4 | 1.0 | 20 | R | 40 | 100 | 1100 | 90 | 10 | 50 | 8 | 218 | 9 |
| * II-5 | 1.5 | 20 | R | 40 | 100 | 1100 | 90 | 10 | 50 | 12 | 204 | 15 |
| II-6 | 0.5 | 20 | P | 40 | 100 | 1100 | 90 | 10 | 50 | 5 | 227 | 7 |
| II-7 | 0.5 | 20 | H | 40 | 100 | 1100 | 90 | 10 | 50 | 6 | 229 | 8 |
| * II-8 | 0.5 | 20 | — | 0 | 100 | 1100 | 90 | 10 | 50 | 14 | 180 | 10 |
| II-9 | 0.5 | 20 | R | 10 | 100 | 1100 | 90 | 10 | 50 | 7 | 217 | 9 |
| II-10 | 0.5 | 20 | R | 20 | 100 | 1100 | 90 | 10 | 50 | 6 | 223 | 8 |
| II-11 | 0.5 | 20 | R | 50 | 100 | 1100 | 90 | 10 | 50 | 6 | 225 | 8 |
| II-12 | 0.5 | 20 | R | 100 | 100 | 1100 | 90 | 10 | 50 | 5 | 227 | 9 |
| II-13 | 0.5 | 20 | R | 40 | 0 | 1100 | 90 | 10 | 50 | 6 | 225 | 8 |
| II-14 | 0.5 | 20 | R | 40 | 20 | 1100 | 90 | 10 | 50 | 5 | 230 | 7 |
| II-15 | 0.5 | 20 | R | 40 | 35 | 1100 | 90 | 10 | 50 | 4 | 230 | 6 |
| II-16 | 0.5 | 20 | R | 40 | 50 | 1100 | 90 | 10 | 50 | 3 | 230 | 5 |
| II-17 | 0.5 | 20 | R | 40 | 150 | 1100 | 90 | 10 | 50 | 2 | 230 | 5 |
| II-18 | 0.5 | 20 | R | 40 | 200 | 1100 | 90 | 10 | 50 | 4 | 230 | 6 |

TABLE 3-continued

| | Process | | | | | | | Evaluation | | | | |
| | Material | Sheet | | Pressing | | Firing | | t | T | | $d_{31}$ | |
| Sample No. | Diameter μm | Thickness μm | Method | Pressure MPa | Temperature °C. | Temperature °C. | $O_2$ % | Mean μm | Mean μm | Variation % | Mean pm/V | Variation % |
|---|---|---|---|---|---|---|---|---|---|---|---|---|
| II-19 | 0.5 | 20 | R | 40 | 250 | 1100 | 90 | 10 | 50 | 5 | 230 | 7 |
| II-20 | 0.5 | 20 | R | 40 | 300 | 1100 | 90 | 10 | 50 | 6 | 230 | 0 |
| II-21 | 0.5 | 20 | R | 40 | 100 | 1100 | 80 | 10 | 50 | 7 | 210 | 10 |
| II-22 | 0.5 | 20 | R | 40 | 100 | 1100 | 90 | 10 | 50 | 6 | 225 | 8 |
| II-23 | 0.5 | 20 | R | 40 | 100 | 1100 | 95 | 10 | 50 | 6 | 220 | 0 |
| II-24 | 0.5 | 10 | R | 40 | 100 | 1100 | 90 | 5 | 50 | 8 | 227 | 9 |
| II-25 | 0.5 | 15 | R | 40 | 100 | 1100 | 90 | 8 | 50 | 6 | 225 | 8 |
| II-26 | 0.5 | 35 | R | 40 | 100 | 1100 | 90 | 20 | 50 | 8 | 226 | 8 |
| II-27 | 0.5 | 50 | R | 40 | 100 | 1100 | 90 | 30 | 50 | 5 | 219 | 7 |
| II-28 | 0.5 | 60 | R | 40 | 100 | 1100 | 90 | 50 | 50 | 5 | 220 | 7 |
| II-29 | 0.5 | 20 | R | 40 | 100 | 1100 | 90 | 10 | 30 | 0 | 230 | 9 |
| II-30 | 0.5 | 20 | R | 40 | 100 | 1100 | 90 | 10 | 40 | 7 | 230 | 9 |
| II-31 | 0.5 | 20 | R | 40 | 100 | 1100 | 90 | 10 | 50 | 6 | 225 | 8 |
| II-32 | 0.5 | 20 | R | 40 | 100 | 1100 | 90 | 10 | 70 | 5 | 220 | 7 |
| II-33 | 0.5 | 20 | R | 40 | 100 | 1100 | 90 | 10 | 100 | 5 | 216 | 7 |
| * II-34 | 0.5 | 20 | R | 40 | 100 | 1100 | 90 | 10 | 150 | 5 | 199 | 11 |

Sample numbers marked with * are not within the scope of the present invention
R: Roll pressing
P: Plane pressing
H: Hydrostatic pressing Samples N s. II-1 to 4, I-6 to 7, and II-9 to 33 showed variation in thickness of the entire actuator of 8% or less and variation in d constant of 10% or less.

To the contrary, Sample No. II-5, that shows large variation in thickness T of the actuator of 12% because the stock material has a large grain size of 1.5 μm, showed significant variation in d constant of 15%. Sample No. II-8, that shows large variation in thickness T of the actuator of 14% because of including no pressing step, showed significant variation in d constant of 19%.

Sample No. II-34 comprising an actuator having a large thickness of 150 μm showed variation in total thickness of 5%, but showed a small d constant of 199 pm/V and variation in d constant of 11%.

EXAMPLE III

The actuator of the present invention was manufactured and bonded onto the supporting substrate 33 shown in FIG. 8.

First, a powder of piezoelectric ceramic material containing lead ziconate titanate having purity of 99% or higher was prepared as the stock material. The piezoelectric ceramic powder containing lead zirconate titanate as a main component was mixed with butyl methacrylate used as an aqueous binder, ammonium polycarbonate used as a dispersant and isopropyl alcohol and water used as solvents, to obtain a slurry. The slurry was spread over a carrier film by a doctor blade method to form a green sheet having a thickness of about 30 μm.

Using powders of various piezoelectric ceramic materials, green sheets were formed in the same manner. Also a paste to form the internal electrode was prepared. The resulting paste was applied to the surface of the green sheet to a thickness of 4 μm by printing, thereby forming an internal electrode. A green sheet with the side on which the internal electrode was printed facing upward was interposed between two green sheets without any internal electrode printed thereon, and pressed to obtain a laminated green compact.

The laminated green compact, after being debinded, was interposed between a pair of supporting members, as shown in FIG. 6, and then put in a firing furnace while being interposed between supporting members (d1). For sample No. III-10, a spacer having a thickness of 600 μm was disposed on a porous supporting member and, after disposing the other porous supporting member thereon, a laminated green compact was disposed between upper and lower supporting members and then put in a firing furnace (d2).

Piezoelectric ceramics comprising a piezoelectric layer and an internal electrode were manufactured by firing such a green compact in an atmosphere containing 99% or more of oxygen for two hours at a temperature shown in Table 4. Then a surface electrode was formed on one surface of the resulting piezoelectric ceramics by applying Au paste using a screen printing method and firing at a temperature from 600 to 800° C. in air atmosphere. 600 points of the surface electrode were formed on one substrate.

The porosity of the resulting piezoelectric substrate was determined by the following procedure. That is, a sintered body was cut and its cross section was mirror-polished. Then, an area of pores in a predetermined area was determined while observing by a microscope and the porosity was calculated. The flatness was determined by scanning from one end to other end of the piezoelectric substrate to measure the variation of height.

$d_{31}$ of the actuator was measured in the same manner as in Example I.

Displacement was measured using a displacement element 37 shown in FIG. 8, that was made so that the actuator 31 obtained above is bonded with a supporting member 33 comprising grooves 33a and partition walls 33b, a piezoelectric vibration layer 34 being interposed between an internal electrode 35 and surface electrodes 36. The actuator was irradiated with laser beam on the side of a supporting substrate 33 through the groove 33a by means of a laser Dropper displacement meter, so as to measure displacement at the center and seven points along the periphery of the groove 33a of the supporting substrate 33, and the displacement were averaged. The results are shown in Table 4.

The thickness of the actuator was measured by a micrometer, while the surface roughness of the supporting member and actuator was measured by a probe type surface roughness meter. As the supporting member, those shown in Table 4 were used.

disposed between supporting members using a spacer, showed large flatness of 48 μm.

Although the present invention has been described in relation to particular embodiments thereof, many other variation and other uses will become apparent to those skilled in the art. Therefore, the present invention is to be limited not by the specific disclosure herein but only by the appended claims.

TABLE 4

| | | Supporting member | | | Process | | Actuator | | | | |
| | | | | | Firing | | Whole | | | $d_{31}$ | |
| Sample No. | Kind | Flatness μm | Ra μm | Porosity % | Temperature °C. | Arrangement | Thickness μm | Surface Flatness | Ra | Mean pm/V | Variation % | Displacement nm |
|---|---|---|---|---|---|---|---|---|---|---|---|---|
| III-1 | A | 10 | 2 | 0.08 | 1000 | d1 | 60 | 10 | 2.5 | 253 | 5 | 72 |
| III-2 | A | 15 | 2 | 0.08 | 1000 | d1 | 60 | 15 | 2.5 | 254 | 5 | 73 |
| III-3 | A | 20 | 2 | 0.08 | 1000 | d1 | 00 | 20 | 2.5 | 252 | 9 | 71 |
| * III-4 | A | 30 | 2 | 0.08 | 1000 | d1 | 60 | 30 | 2.5 | 254 | 27 | 72 |
| III-5 | A | 15 | 2 | 0.03 | 1000 | d1 | 60 | 15 | 2.5 | 251 | 5 | 71 |
| III-6 | A | 15 | 2 | 0.1 | 1000 | d1 | 60 | 15 | 2.5 | 253 | 6 | 73 |
| III-7 | A | 15 | 2 | 0.5 | 1000 | d1 | 60 | 15 | 2.5 | 253 | 6 | 73 |
| III-8 | A | 15 | 2 | 1 | 1000 | d1 | 60 | 15 | 2.5 | 252 | 16 | 74 |
| * III-9 | A | 15 | 2 | 3 | 1000 | d1 | 60 | 25 | 5 | 221 | 30 | 72 |
| * III-10 | A | — | — | 16 | 1000 | d2 | 60 | 48 | 7 | 198 | 45 | 56 |
| III-11 | A | 15 | 0.5 | 0.05 | 1000 | d1 | 60 | 15 | 0.7 | 251 | 5 | 71 |
| III-12 | A | 15 | 1 | 0.05 | 1000 | d1 | 60 | 15 | 1.2 | 253 | 6 | 73 |
| III-13 | A | 15 | 1.5 | 0.05 | 1000 | d1 | 60 | 15 | 2 | 252 | 8 | 74 |
| III-14 | A | 15 | 2.5 | 0.05 | 1000 | d1 | 60 | 15 | 3 | 254 | 10 | 72 |
| III-15 | A | 15 | 3 | 0.08 | 1000 | d1 | 60 | 15 | 3.6 | 248 | 15 | 70 |
| III-16 | A | 15 | 2 | 0.08 | 1000 | d1 | 40 | 15 | 2.5 | 255 | 5 | 74 |
| III-17 | A | 15 | 2 | 0.00 | 1000 | d1 | 60 | 15 | 2.5 | 256 | 6 | 73 |
| III-18 | A | 15 | 2 | 0.08 | 1000 | d1 | 80 | 15 | 2.5 | 255 | 5 | 71 |
| III-19 | A | 15 | 2 | 0.08 | 1000 | d1 | 100 | 15 | 2.5 | 254 | 6 | 70 |
| * III-20 | A | 15 | 2 | 0.08 | 1000 | d1 | 1000 | 15 | 2.5 | 253 | 5 | 20 |
| III-21 | A | 15 | 2 | 0.08 | 900 | d1 | 60 | 15 | 2.5 | 257 | 8 | 72 |
| III-22 | A | 15 | 2 | 0.08 | 950 | d1 | 60 | 15 | 2.5 | 253 | 7 | 73 |
| III-23 | A | 15 | 2 | 0.08 | 1050 | d1 | 60 | 15 | 2.5 | 254 | 5 | 74 |
| III-24 | B | 15 | 2 | 0.08 | 1000 | d1 | 60 | 15 | 2.5 | 255 | 5 | 72 |
| III-25 | C | 15 | 2 | 0.08 | 1000 | d1 | 60 | 15 | 2.5 | 256 | 5 | 73 |
| III-26 | D | 15 | 2 | 0.08 | 1000 | d1 | 60 | 15 | 2.5 | 254 | 4 | 74 |
| III-27 | E | 15 | 2 | 0.09 | 1000 | d1 | 60 | 15 | 2.5 | 255 | 5 | 70 |
| III-28 | F | 15 | 2 | 0.08 | 1000 | d1 | 60 | 15 | 2.5 | 255 | 5 | 73 |
| III-29 | G | 15 | 2 | 0.08 | 1000 | d1 | 60 | 15 | 2.5 | 253 | 6 | 72 |
| III-30 | H | 15 | 2 | 0.08 | 1000 | d1 | 60 | 15 | 2.5 | 253 | 5 | 73 |
| III-31 | I | 15 | 2 | 0.08 | 1000 | d1 | 60 | 15 | 2.5 | 251 | 6 | 74 |
| III-32 | J | 15 | 2 | 0.08 | 1000 | J1 | 60 | 15 | 2.5 | 254 | 4 | 74 |

Sample numbers marked with * are not within the scope of the present invention
A: Zirconia
B: Spinel
C: Magnesia
D: Mullite
E: Alumina
F: Dismuth layer structuerd compound($SrBi_4Ti_4O_{15}$)
G: Tungsten bronze structure compound ($Sr_gNaNb_2O_{15}$)
H: Pb-type Perovskite structure compound(PZT)
I: Nb type Perovskite structure compound($NaNbO_3$)
J: Ja-type Perovskite structure compound(l $iTaO_3$)

Samples Nos. III-1 to 3, III-5 to 8, III-11 to 19 and III-21 to 32 showed variation in $d_{31}$ of 15% or less and displacement of 70 nm or more.

Sample No. III-4 comprising a supporting member having large flatness of 30 μm, showed significant variation in $d_{31}$ of 27%. Sample No. III-20 having a large total thickness of 1000 μm (1 mm) showed very low displacement characteristic with a low displacement of 20 nm.

Sample No. III-9 comprising a supporting member having large porosity of 3%, showed significant variation in $d_{31}$ of 30%. Sample No. III-10 wherein a green compact was

What is claimed is:

1. A method of manufacturing piezoelectric ceramics comprising the steps of:
    disposing a green compact comprising a piezoelectric ceramic powder on a supporting member whose surface has porosity of 5% or less and flatness 20 μm or less; and
    firing the green compact while contacting with the surface of the supporting member, wherein the green compact comprising a piezoelectric ceramic powder of a perovskite compound containing Pb is fired while being inserted into a sealed space, which satisfies the relations represented by the following expressions (1) and (2):

$$1.0001 \times (V2+V3) \leq V1 \leq 4.0000 \times (V2+V3) \quad (1)$$

$$0.02 \times V3 \times V2 \leq 50 \times V3 \quad (2)$$

where V1 denotes a volume of a sealed space, V2 denotes a volume of a supporting member and V3 denotes a volume of a green compact, when a supporting member having surface roughness Ra of 1 μm or less, flatness of 20 μm or less and a volume V2 is placed on the green compact having a volume V3 and they are inserted into the sealed space having a volume V1.

* * * * *